(12) United States Patent
Rahimi-Keshari et al.

(10) Patent No.: US 10,921,397 B2
(45) Date of Patent: Feb. 16, 2021

(54) HYPERPOLARIZED MICRO-NMR SYSTEM AND METHODS

(71) Applicant: Memorial Sloan Kettering Cancer Center, New York, NY (US)

(72) Inventors: Kayvan Rahimi-Keshari, New York, NY (US); Sangmoo Jeong, New York, NY (US)

(73) Assignee: Memorial Sloan Kettering Cancer Center, New York, NY (US)

( * ) Notice: Subject to any disclaimer, the term of this patent is extended or adjusted under 35 U.S.C. 154(b) by 0 days.

(21) Appl. No.: 16/082,225

(22) PCT Filed: Mar. 8, 2017

(86) PCT No.: PCT/US2017/021355
§ 371 (c)(1),
(2) Date: Sep. 4, 2018

(87) PCT Pub. No.: WO2014/156124
PCT Pub. Date: Sep. 14, 2017

(65) Prior Publication Data
US 2020/0292640 A1 Sep. 17, 2020

Related U.S. Application Data

(60) Provisional application No. 62/306,538, filed on Mar. 10, 2016.

(51) Int. Cl.
*G01R 33/30* (2006.01)
*G01N 24/08* (2006.01)
(Continued)

(52) U.S. Cl.
CPC ......... *G01R 33/302* (2013.01); *G01N 24/088* (2013.01); *G01R 33/282* (2013.01); *G01R 33/34092* (2013.01)

(58) Field of Classification Search
USPC ....................................... 324/309
See application file for complete search history.

(56) References Cited

U.S. PATENT DOCUMENTS

| 6,456,072 | B1 | 9/2002 | Webb et al. | |
|---|---|---|---|---|
| 2009/0128147 | A1* | 5/2009 | Slade | G01R 33/307 324/309 |

(Continued)

FOREIGN PATENT DOCUMENTS

WO WO-2006/011810 A2 2/2006

OTHER PUBLICATIONS

Anderson, Weston A.: "Electrical Current Shims for Correcting Magnetic Fields," The Review of Scientific Instruments, vol. 32, No. 3, American Institute of Physics, pp. 241-250, dated Mar. 1961, 11 pages.

(Continued)

*Primary Examiner* — Rodney E Fuller
(74) *Attorney, Agent, or Firm* — Foley & Lardner LLP

(57) ABSTRACT

Described herein are micro-coil hyperpolarized NMR systems and methods for measuring metabolic flux in living and non-living samples. Such systems can perform high throughput measurements (with multiple coils) of metabolic flux without destroying the material, making it useful to analyze tumor biopsies, cancer stem cells, and the like. In certain embodiments, a hyperpolarized micromagnetic resonance spectrometer (HMRS), described herein, is used to achieve real-time, significantly more sensitive (e.g., $10^3$-fold more sensitive) metabolic analyses of live cells or non-living samples. In this platform, a suspension mixed with hyperpolarized metabolites is loaded into a miniaturized detection coil (e.g., about 2 µL), where the flux analysis can be completed within a minute without significant changes in viability. The sensitive and rapid analytical capability of the provided systems enables rapid assessment of metabolic (Continued)

changes by a given drug, which may direct therapeutic choices in patients.

20 Claims, 29 Drawing Sheets

(51) Int. Cl.
*G01R 33/28* (2006.01)
*G01R 33/34* (2006.01)

(56) References Cited

U.S. PATENT DOCUMENTS

| | | | | |
|---|---|---|---|---|
| 2010/0317959 A1* | 12/2010 | Elgort | ................... | G01N 24/08 600/410 |
| 2010/0327866 A1* | 12/2010 | Albu | ...................... | G01N 24/08 324/304 |
| 2019/0053760 A1* | 2/2019 | Gerald, II | ............. | A61B 5/055 |
| 2020/0033427 A1* | 1/2020 | Carret | ................. | G01R 33/307 |

OTHER PUBLICATIONS

Ardenkjaer-Larsen, Jan H., et al.: "Increase in signal-to-noise ratio of >10,000 times in liquid-state NMR," Proceedings of the National Academy of Sciences of the United States of America, vol. 100, No. 18, pp. 10158-10163, dated Sep. 2, 2003, 6 pages.
Badilita V, et al.: "3D solenoidal microcoil arrays with CMOS integrated amplifiers for parallel MR imaging and spectroscopy," IEEE 24th International Conference on Micro Electro Mechanical Systems (MEMS 2011), IEEE, US, pp. 809-812, dated Jan. 23, 2011, 4 pages.
Baek, GuemHee, et al.: "MCT4 Defines a Glycolytic Subtype of Pancreatic Cancer with Poor Prognosis and Unique Metabolic Dependencies," Cell Reports, vol. 9, No. 6, pp. 2233-2249, dated Dec. 24, 2014, 18 pages.
Barnes, Kay, et al.: "Chronic myeloid leukemia: an investigation into the role of Bcr-Abl-induced abnormalities in glucose transport regulation," Oncogene, vol. 24, pp. 3257-3267, Nature Publishing Group, dated May 5, 2005, 11 pages.
Baxan N., et al.: "Phase contrast based MR Microscopy of gilal tumor cells using microcoils," Proceedings of the International Society for Magnetic Resonance in Medicine, ISMRM-ESMRMB Joint Annual Meeting, Stockholm, Sweden, p. 731, dated May 1, 2010, 1 page.
Chang, Chih-Hao, et al.: "Metabolic Competition in the Tumor Microenvironment is a Driver of Cancer Progression," Cell, CellPress, vol. 162, pp. 1229-1241, dated Sep. 10, 2015, 14 pages.
Chen, Albert P., et al.: "Single voxel localization for dynamic hyperpolarized 13C MR spectroscopy," Journal of Magnetic Resonance, vol. 258, pp. 81-85, dated Sep. 2015, 5 pages.
Commisso, Cosimo, et al.: "Macropinocytosis of protein is an amino acid supply route in Ras-transformed cells," Nature, vol. 497, pp. 633-637, dated May 30, 2013, 6 pages.
Day, Sam E., et al.: "Detecting tumor response to treatment using hyperpolarized 13C magnetic resonance imaging and spectroscopy," Nature Medicine, vol. 13, No. 11, pp. 1382-1387, dated Nov. 12, 2007, 6 pages.
Dimopoulos, Meletios, A., et al.: "High Serum Lacatate Dehydrogenase Level as a Marker for Drug Resistance and Short Survival in Multiple Myeloma," Annals of Internal Medicine, vol. 115, No. 12, pp. 931-935, dated Dec. 15, 1991, 6 pages.
Fischer, Karin, et al.: "Inhibitory effect of tumor cell-aerivea lactic acid on human I cells," Blood, vol. 109, No. 9, pp. 3812-3819, dated May 1, 2007, 9 pages.
Gonnella N.C.: "DNP and NMR Sensitivity," in "LC-NMR Expanding the Limits of Structure Elucidation," 2013, CRC Press, Boca Raton, London, New York, p. 254, 2 pages.

Gottfried, Eva, et al.: "Tumor-derived lactic acid modulates dendritic cell activation and antigen expression," Blood, vol. 107, No. 5, pp. 2013-2021, dated Mar. 1, 2006, 10 pages.
Hanahan, Douglas and Weinberg, Robert A.: "Hallmarks of Cancer: The Next Generation," Cell, Leading Edge Review, vol. 144, No. 5, pp. 646-674, dated Mar. 4, 2011, 29 pages.
Hans Weber, et al.: "Microcoil-based MRI: feasibility study and cell culture applications using a conventional animal system," Magnetic Resonance Materials in Physics, Biology and Medicine, Chapman and Hall, London, GB, vol. 24, No. 3, pp. 137-145, dated Feb. 18, 2011, 9 pages.
Hu, Simon, et al.: "13C-Pyruvate Imaging Reveals Alterations in Glycolysis that Precede c-Myc-lnduced Tumor Formation and Regression," Cell Metabolism, Resource, CellPress, vol. 14, No. 1, pp. 131-142, dated Jul. 6, 2011, 12 pages.
Huntly, Brian J.P. and Gilliland, D. Gary: "Leukaemia stem cells and the evolution of cancer-stem-cell research," Nature Reviews Cancer, vol. 5, pp. 311-321, dated Apr. 1, 2005, 12 pages.
International Search Report and Written Opinion for PCT/US2017/021355 dated Jun. 23, 2017, 19 pages.
Ishii, Masaru, et al.: "Hyperpolarized 13C MRI of the Pulmonary Vasculature and Parenchyma," Magnetic Resonance in Medicine, vol. 57, No. 3, pp. 459-463, dated Mar. 2007, 5 pages.
Jeong, Sangmoo, et al.: "Real-Time Quantitative Analysis of Metabolic Flux in Live Cells using Hyperpolarized Micromagnetic Resonance Spectrometer," Science Advances, vol. 3, No. 6, dated Jun. 16, 2017, 10 pages.
Kamphorst, Jurre J., et al.: "Human Pancreatic Cancer Tumors are Nutrient Poor and Tumor Cells Actively Scavange Extracellular Protein," Cancer Research, Molecular and Cellular Pathobiology, vol. 75, No. 3, pp. 544-553, dated Feb. 1, 2015, 10 pages.
Keller, Kirstie E., et al.: "SAICAR Stimulates Pyruvate Kinase Isoform M2 and Promotes Cancer Cell Survival in Glucose-Limited Conditions," Science, vol. 338, pp. 1069-1072, dated Nov. 23, 2012, 5 pages.
Keshari, Kayvan R. and Wilson, David M.: "Chemistry and biochemistry of 13C hyperpolarized magnetic resonance using dynamic nuclear polarization," Chemical Society Reviews, vol. 45, No. 5, pp. 1627-1659, dated Mar. 7, 2014, 70 pages.
Keshari, Kayvan R., et al.: "Hyperpolarized 13C dehydroascorbate as an endogenous redox sensor for in vivo metabolic imaging," Proceedings of the National Academy of Sciences of the United States of America, vol. 108, No. 46, pp. 18606-18611, dated Nov. 15, 2011, 8 pages.
Keshari, Kayvan R., et al.: "Hyperpolarized 13C-Pyruvate Magnetic Resonance Reveals Rapid Lactate Export in Metastatic Renal Cell Carcinomas," Cancer Research, vol. 73, No. 2, pp. 529-538, dated Jan. 15, 2013, 10 pages.
Keshari, Kayvan R., et al.: "Metabolic Reprogramming and Validation of Hyperpolarized 13C Lactate as a Prostate Cancer Biomarker Using a Human Prostate Tissue Slice Culture Bioreactor," Prostate, vol. 73, No. 11, pp. 1171-1181, dated Aug. 2013, 18 pages.
Kharas, Michael G., et al.: "Ablation of PI3K blocks BCR-ABL leukemogenesis in mice, and a dual PI3K/mTOR inhibitor prevents expansion of human BCR-ABL leukemia cells," The Journal of Clinical Investigation, vol. 118, No. 9, pp. 3038-3050, dated Sep. 2008, 13 pages.
Kim, Jung-whan, et al.: "HIF-1-mediated expression of pyruvate dehydrogenase kinase: A metabolic switch required for cellular adaptation to hypoxia," Cell Metabolism, vol. 3, pp. 177-185, dated Mar. 2006, 9 pages.
Klawitter, J., et al.: "Time-dependent effects of imatinib in human leukaemia cells: a kinetic NMR-profiling study," British Journal of Cancer, vol. 100, No. 6, pp. 923-931, dated Mar. 3, 2009, 9 pages.
Koukourakis, M.I., et al.: "Lactate dehydrogenase-5 (LDH-5) overexpression in non-small-cell lung cancer tissues is linked to tumour hypoxia, angiogenic factor production and poor prognosis," British Journal of Cancer, vol. 89, No. 5, pp. 877-885, dated Jun. 2003, 9 pages.
Kreso, Antonija and Dick, John E.: "Evolution of the Cancer Stem Cell Model," Cell Stem Cell, CellPress, vol. 14, pp. 275-291, dated Mar. 6, 2014, 17 pages.

(56) References Cited

OTHER PUBLICATIONS

Krivtsov, Andrei V., et al.: "Transformation from committed progenitor to leukaemia stem cell initiated by MLL-AF9," Nature International Journal of Science, vol. 442, pp. 818-822, dated Aug. 17, 2006, 5 pages.
Larson, Peder E.Z., et al.: "Multiband excitation pulses for hyperpolarized 13C dynamic chemical-shift imaging," Journal of Magnetic Resonance, vol. 194, pp. 121-127, dated Jun. 24, 2008, 7 pages.
Lee, Hakho, et al.: "Rapid detection and profiling of cancer cells in fine-needle aspirates," Proceedings of the National Academy of Sciences of the United States of America, vol. 106, No. 30, pp. 12459-12464, dated Jul. 29, 2009, 8 pages.
Lipidot, Tsvee, et al.: "A cell initiating human acute myeloid leukaemia after transplantation into SCID mice," Nature International Journal of Science, vol. 367, pp. 645-648, dated Feb. 17, 1994, 4 pages.
Long-Sheng Fan, et al.: "Miniaturization of Magnetic Resonance Microsyste Components for 3D Cell Imaging," 2007 IEEE International Solid-State Circuits Conference, p. 166, 167, 594, dated Feb. 11, 2007, 3 pages.
Martin Suefke et al.: "External high-quality-factor resonator tunes up nuclear magnetic resonance," Nature Physics, vol. 11, No. 9, pp. 767-771, dated Jul. 6, 2015, 6 pages.
Memorial Sloan Kettering Cancer Center, A micro-coil HP NMR system is ideal for studying metabolism, 3 pages.
Memorial Sloan Kettering Cancer Center, Hyperpolarized micro-NMR system Analysis of Metabolic Flux in <100,000 Cells, 20 pages.
Park, Sun-Mi, et al.: "Musashi2 sustains the mixed-lineage leukemia-driven stem cell regulatory program," The Journal of Clinical Investigation, vol. 125, No. 3, pp. 1286-1298, dated Mar. 2015, 13 pages.
Pavlova, Natalya N. and Thompson, Craig B.: "The Emerging Hallmarks of Cancer Metabolism," Cell Metabolism, CellPress, vol. 23, pp. 27-47, dated Jan. 12, 2016, 21 pages.
Ravi Kc, et al.: "Design and construction of a versatile dual volume heteronuclear double resonance microcoil NMR probe," Journal of Magnetic Resonance, vol. 197, No. 2, pp. 186-192, dated Apr. 1, 2009, 15 pages.
Rizzitelli S., et al.: "MR Spectroscopy of very small volumes (0.4 mul) of 13C-labelled metabolites using microcoil detection: application to online measurements of cerebral microdialysate," Proceedings of the International Society for Magnetic Resonance in Medicine, 23rd Annual Meeting and Exhibition, Toronto, Canada, No. 4702, p. 4702, dated May 15, 2015, 1 page.
Rodrigues, Tiago B., et al.: "Magnetic resonance imaging of tumor glycolysis using hyperpoiarized 13C-labeled glucose," Nature Medicine, Technical Reports, vol. 20, No. 1, pp. 93-97, dated Jan. 2014, 6 pages.

Rofstad, Einar K., et al.: "Acidic Extracellular pH Promotes Experimental Metastasis of Human Melanoma Cells in Athymic Nude Mice," Cancer Research, vol. 66, No. 13, pp. 6699-6707, dated Jul. 1, 2006, 9 pages.
Skorski, Tomasz, et al.: "Phosphatidylinositol-3 Kinase Activity is Regulated by BCR/ABL and is Required for the Growth of Philadelphia Chromosome-Positive Cells," Blood, vol. 86, No. 2, pp. 726-736, dated Jul. 15, 1995, 12 pages.
Somervaille, Tim C.P., et al.: "Hierarchical Maintenance of MLL Myeloid Leukemia Stem Cells Employs a Transcriptional Program Shared with Embryonic Rather Than Adult Stem Cells," Cell Stem Cell, CellPress, vol. 4, pp. 129-140, dated Feb. 6, 2009, 12 pages.
Sriram, Renuka, et al.: "Real Time Measurement of Hyperpolarized Lactate Production and Efflux as a Biomarker of Tumor Aggressiveness in an MR compatible 3D Culture Bioreactor," NMR in Biomedicine, vol. 28, No. 9, pp. 1141-1149, dated Sep. 2015, 21 pages.
Stroobants, S., et al.: "18FDG-Positron emission tomography for the early prediction of response in advanced soft tissue sarcoma treated with imatinib mesylate (Glivec (R))," Eurpoean Journal of Cancer, vol. 30, No. 14, pp. 2012-2020, dated Sep. 2003, 9 pages.
Sysms R. R. A., et al.: "Batch Fabrication of Micro-Coils for MR Spectroscopy on Silicon," 2005 IEEE Sensors, IEEE—Piscataway, NJ, USA, pp. 227-230, dated Oct. 31, 2005, 4 pages.
Tee, Sui Seng, et al.: "Sampling Hyperpolarized Molecules Utilizing a 1 Tesla Permanent Magnetic Field," Scientific Reports, vol. 6, 32846, dated Sep. 6, 2016, 6 pages.
Tong, Wing-Hang, et al.: "The Glycolytic Shift in Fumarate-Hydratase-Deficient Kidney Cancer Lowers AMPK Levels, Increases Anabolic Propensities and Lowers Cellular Iron Levels," Cancer Cell, CellPress, vol. 20, pp. 315-327, dated Sep. 13, 2011, 13 pages.
Vander Heiden, Matthew G., et al.: "Understanding the Warburg Effect: The Metabolic Requirements of Cell Proliferation," Science, vol. 324, pp. 1029-1033, dated May 22, 2009, 6 pages.
Walenta, Stefan, et al.: "High Lactate Levels Predict Likelihood of Metastases, Tumor Recurrence, and Restricted Patient Survival in Human Cervical Cancers," vol. 60, pp. 916-921, dated Feb. 15, 2000, 6 pages.
Warburg, Otto, et al.: "The Metabolism of Tumors in the Body," The Journal of General Physiology, vol. 8, No. 6, pp. 519-530, dated Mar. 7, 1927, 12 pages.
Webb, Andrew: "Increasing the Sensitivity of Magnetic Resonance Spectroscopy and Imaging," Analytical Chemistry, vol. 84, No. 1, pp. 9-16, dated 2012, 8 pages.
Yang, Chendong, et al.: "Simultaneous Steady-state and Dynamic 13C NMR Can Differentiate Alternative Routes of Pyruvate Metabolism in Living Cancer Cells," The Journal of Biological Chemistry, vol. 289, No. 9, pp. 6212-6224, dated Feb. 28, 2014, 16 pages.
Zalesskiy, Sergey S., et al.: "Miniaturization of NMR Systems: Desktop Spectrometers, Microcoil Spectroscopy, and 'NMR on a Chip' for Chemistry, Biochemistry, and Industry," Chemical Reviews, vol. 114, No. 11, pp. 5641-5694, dated Apr. 19, 2014, 54 pages.

\* cited by examiner

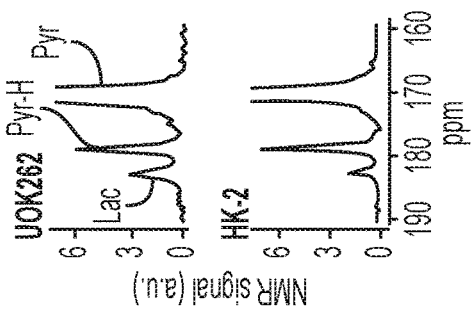
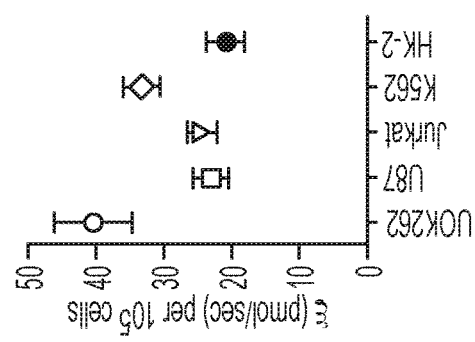
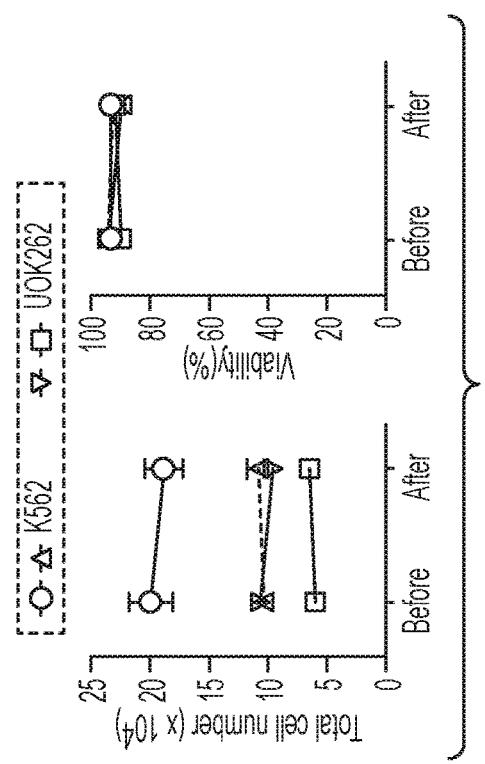
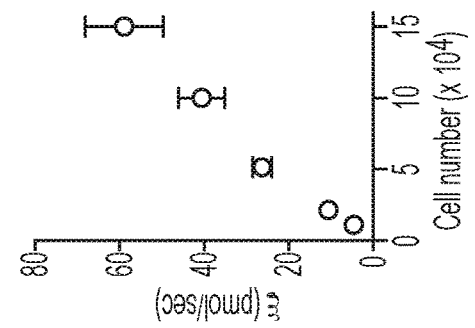
FIG. 3C
FIG. 3B
FIG. 3D
FIG. 3A

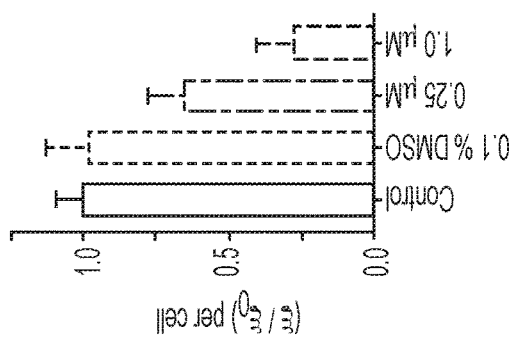
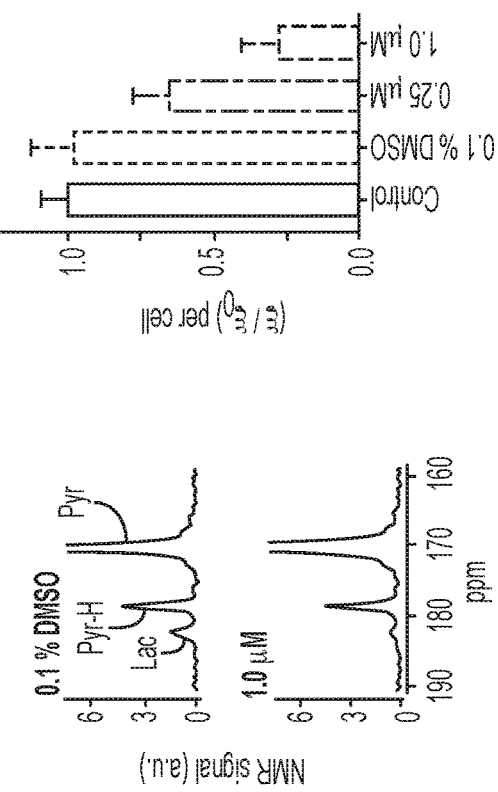
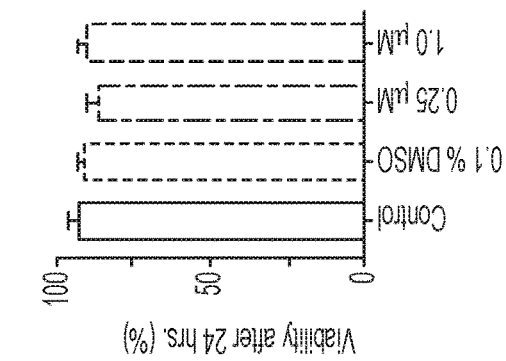
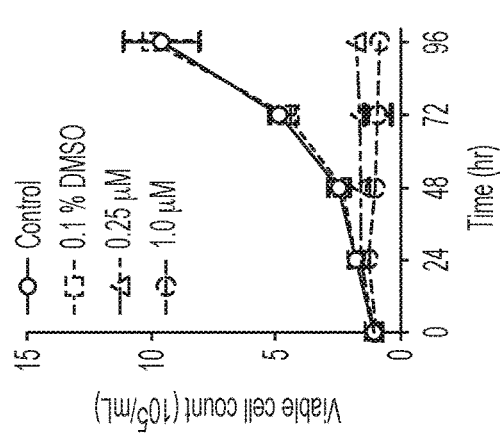
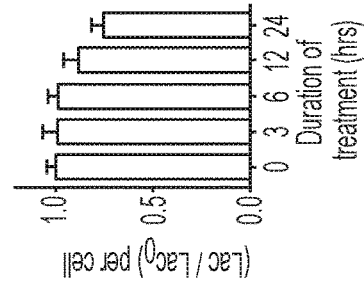
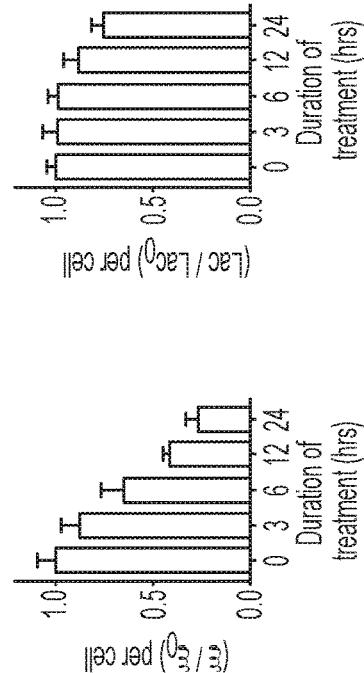
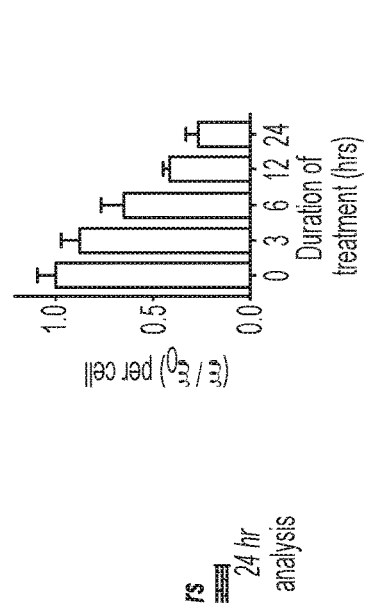
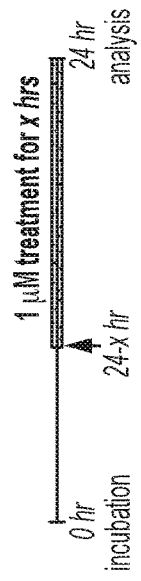

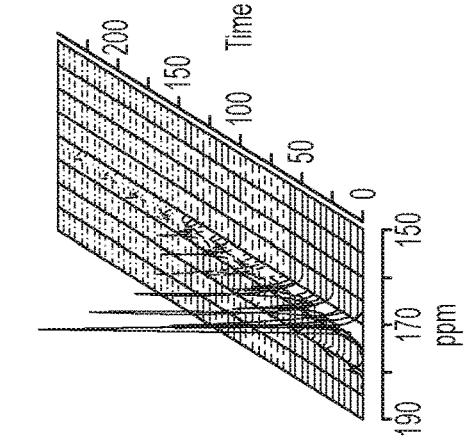
FIG. 6C
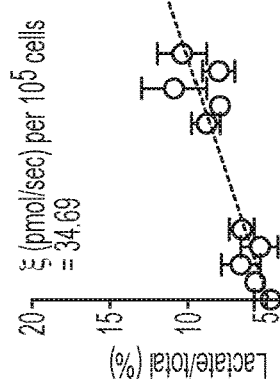
FIG. 6B
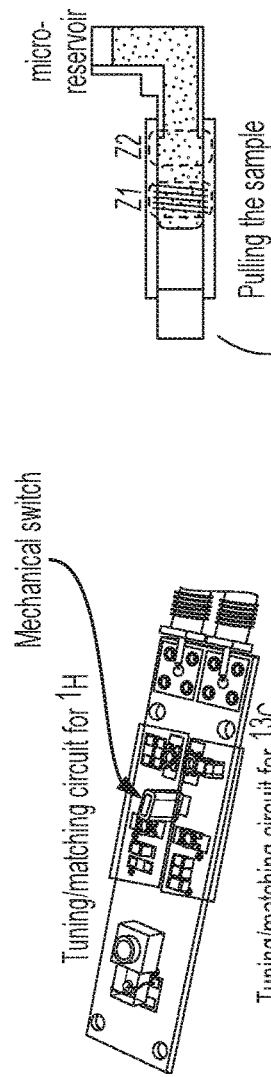
FIG. 6A
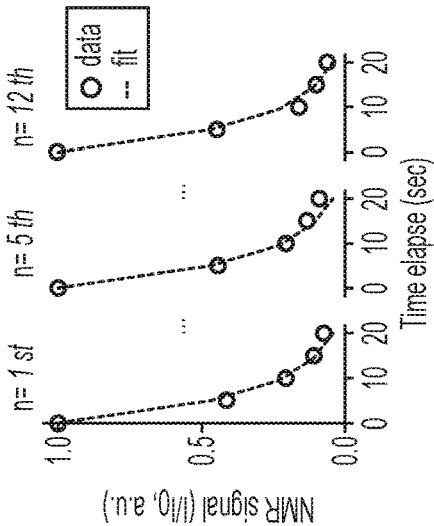
FIG. 6E
FIG. 6D $$\frac{dPyr}{dt} = -k_{PL} \times Pyr - Pyr/T_{Pyr} + k_{LP} \times Lac$$

$$\frac{dLac}{dt} = k_{PL} \times Pyr - Lac/T_{Lac} - k_{LP} \times Lac$$

$k_{PL}$: the rate constant for the conversion from pyruvate to lactate
$k_{LP}$: the rate constant for the conversion from lactate to pyruvate
$T_{Pyr}$: the spin-lattice relaxation time of hyperpolarized pyruvate
$T_{Lac}$: the spin-lattice relaxation time of hyperpolarized lactate $$\frac{dLac/(Lac + Pyr + Pyr \cdot H)}{dt} \approx \frac{dLac/(Lac + Pyr)}{dt}$$

$$= \frac{(Lac + Pyr) \times (dLac/dt) - Lac \times (dLac/dt + dPyr/dt)}{(Lac + Pyr)^2}$$

$$= \frac{(Lac + Pyr) \times (k_{PL} \times Pyr - Lac/T_{Lac} - k_{LP} \times Lac) - Lac \times (-Lac/T_{Lac} - Pyr/T_{Pyr})}{(Lac + Pyr)^2}$$

$$= \frac{(k_{PL} \times Pyr \times Lac) + (k_{PL} \times Pyr^2) - (k_{LP} \times Lac^2) - (k_{LP} \times Lac \times Pyr) + (1/T_{Pyr} - 1/T_{Lac}) \times Pyr \times Lac}{Lac^2 + Pyr^2 + (2 \times Lac \times Pyr)}$$

$$= \frac{(k_{PL} \times Lac/Pyr) + k_{PL} - k_{LP}(Lac/Pyr)^2 - k_{LP} \times (Lac/Pyr) - (1/T_{Pyr} - 1/T_{Lac}) \times (Lac/Pyr)}{(Lac/Pyr)^2 + 1 + 2 \times (Lac/Pyr)}$$

$$= \frac{\{k_{PL} \times (Lac/Pyr + 1)\} - \{k_{LP} \times (Lac/Pyr) \times (Lac/Pyr + 1)\} - (1/T_{Pyr} - 1/T_{Lac}) \times (Lac/Pyr)}{(Lac/Pyr + 1)^2}$$

$$= \frac{k_{PL}}{(Lac/Pyr + 1)} - \frac{k_{LP} \times (Lac/Pyr)}{(Lac/Pyr + 1)} - \frac{(1/T_{Pyr} - 1/T_{Lac}) \times (Lac/Pyr)}{(Lac/Pyr + 1)^2}$$

$\approx \{k_{PL} \times (1-Lac/Pyr) - k_{LP} \times (Lac/Pyr) \times (1-Lac/Pyr) - (1/T_{Pyr} - 1/T_{Lac}) \times (Lac/Pyr) \times \{1-2 \times (Lac/Pyr)\}$
$\approx k_{PL} - (1/T_{Pyr} - 1/T_{Lac}) \times (Lac/Pyr)$
$\approx k_{PL}$

FIG. 9

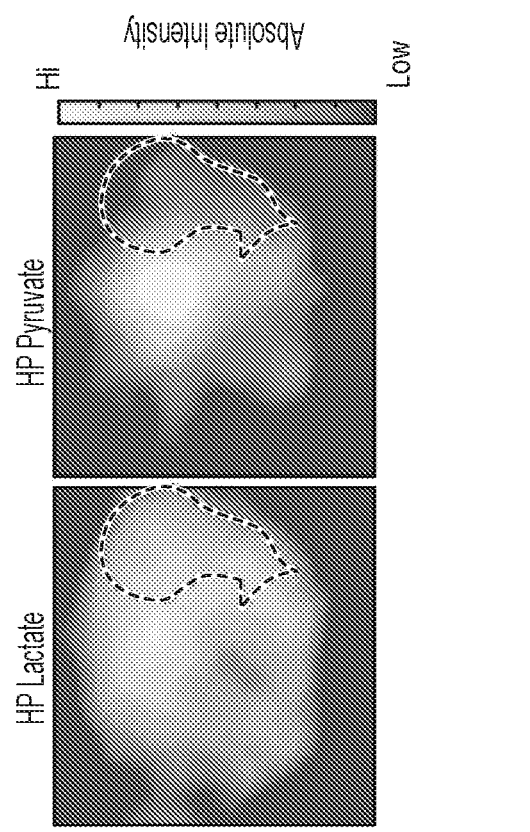
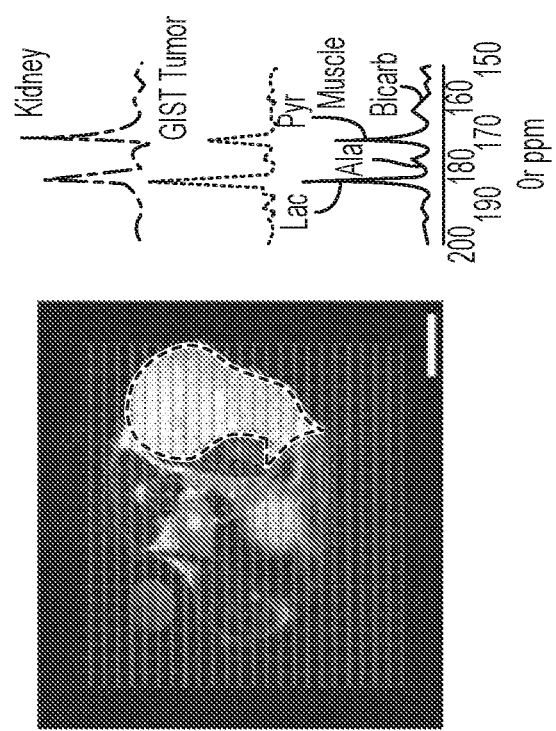
FIG. 16A $$U_S = \pi \left(\frac{d}{2}\right)^2 h$$

$$\frac{B}{i} = \mu \frac{n}{d\sqrt{1+\left(\frac{h}{d}\right)^2}}$$

$$SNR \propto \omega_0^2 \frac{U_S}{V_N} \frac{B}{i}$$

$\omega_0^2$: the Larmor frequency $U_S$: the sample volume $V_N$: the noise level in the system $\frac{B}{i}$: the magnetic field generated by the current $i$

HYPERPOLARIZED MICRO-NMR SYSTEM AND METHODS

CROSS-REFERENCE TO RELATED APPLICATION

This application is a National Stage Application of PCT/US2017/021355, filed Mar. 8, 2017, which claims the benefit of U.S. Application Ser. No. 62/306,538 filed on Mar. 10, 2016, the disclosure of which is hereby incorporated by reference in its entirety.

GOVERNMENT FUNDING

This invention was made with government support under grant numbers EB014328 and CA008748 awarded by National Institutes of Health. The government has certain rights in this invention.

TECHNICAL FIELD

This invention relates generally to systems and methods for analysis of living and non-living samples. In certain embodiments, the invention is related to the detection of metabolic data via a micro-coil hyperpolarized NMR system.

BACKGROUND

Metabolic reprogramming is widely considered a hallmark of cancer, and understanding metabolic dynamics described by the conversion rates or 'fluxes' of metabolites can shed light onto biological processes of tumorigenesis and response to therapy.

For real-time analysis of metabolic flux in intact cells or organisms, magnetic resonance (MR) spectroscopy and imaging methods have been developed in conjunction with hyperpolarization of nuclear spins. These approaches enable non-invasive monitoring of tumor progression and treatment efficacy, and are being tested in multiple clinical trials. Due to their limited sensitivity, however, the methods require a larger number of cells, on the order of $10^7$, which could be impractical in clinical scenarios involving scant target cells or mass-limited samples.

Altered metabolism in cancer, which was first discovered as a mitochondrial defect in the 1920s, is now recognized as one of the hallmarks of cancer. Cancer cells can reprogram their metabolism to promote cellular growth and proliferation, adapt nutrient- or oxygen depleted environments, and escape immune surveillance. A common phenotype is an increased glucose uptake, which can be metabolized through glycolysis, regardless of oxygen availability. Known as aerobic glycolysis or the 'Warburg effect', this pathway provides metabolic intermediates critical for numerous biosynthetic processes, conferring proliferative advantages, and acidifies the tumor microenvironment, promoting metastasis to other organs. Aerobic glycolysis is thus closely correlated with poor prognosis. Considering that the glycolytic rate, or 'flux', represents the metabolic activity of energetic reactions at any given moment derived from glucose, its analysis may describe how cancer cells respond to environmental changes, such as nutrient availability or drug treatment, in real-time.

Nuclear magnetic resonance (NMR) spectroscopy and imaging techniques have been developed in conjunction with hyperpolarization of nuclear spins for real-time analysis of metabolism in intact cells or organs. Dynamic nuclear polarization (DNP), in particular, is an emerging technique that achieves hyperpolarization by transferring polarization from unpaired electrons in a stable organic free radical to neighboring nuclei, demonstrating more than 10,000-fold enhancement of NMR sensitivity. Using $^{13}C$-enriched metabolites (e.g., [1-$^{13}C$] pyruvate or [U-$^{13}C$] glucose, which are NMR active nuclei) as hyperpolarized molecules, the DNP-NMR technique can measure multiple metabolic pathways with minimal toxicity, and its application to cancer diagnosis is undergoing multiple clinical trials. This method, however, requires numerous cells of interest (order of $10^7$), due to its limited sensitivity, and analytical application of DNP-NMR has been challenging with mass-limited samples, including primary cancer cells, stem cells, or organoids.

Thus, there remains a need for systems and methods that can rapidly and accurately analyze a small number of cells, while maintaining cell viability.

SUMMARY OF INVENTION

Described herein are micro-coil hyperpolarized NMR systems and methods for measuring metabolic flux, e.g., from pyruvate to lactate in cancer cells. Such systems can perform high throughput measurements (with multiple coils) of metabolic flux without destroying the material, making it useful to analyze tumor biopsies, cancer stem cells, and the like.

In certain embodiments, a hyperpolarized micromagnetic resonance spectrometer (HMRS), described herein, is used to achieve real-time, significantly more sensitive (e.g., $10^3$-fold more sensitive) metabolic analyses of live cells or non-living samples. In this platform, a cell suspension mixed with hyperpolarized metabolites is loaded into a miniaturized detection coil (e.g., about 2 µL), where the flux analysis can be completed within a minute without significant changes in viability. The sensitive and rapid analytical capability of the HMRS allows characterizing the metabolic flux in cells, e.g., leukemia stem cells, for example. It also enables rapid assessment of metabolic changes by a given drug, which may direct therapeutic choices in patients.

The platform described herein has been engineered for high-throughput analysis of hyperpolarized molecules by integrating a microfluidic system (e.g., a 3D-printed microfluidic system). The HMRS platform operates as a sensitive method for studying metabolic dynamics in mass-limited samples, such as biopsy specimens and stem cells, thereby identifying novel therapeutic targets and providing an enhanced understanding of cellular metabolism, for example.

The provided systems and methods are compatible with a variety of sample types (e.g., biological samples, synthetic samples, environmental samples, and other samples). Further, the provided systems and methods are compatible with a variety of cell types, which can be treated with a variety of inhibitors via a high-throughput platform to determine changes in metabolism due to perturbation of a variety of metabolic pathways. Cell types include cancer cells (e.g., leukemia cancer cell, e.g., solid cancer cell, e.g., cancer stem cell), stromal cells (e.g., fibroblasts), hematopoietic stem cells, neural stem cells, immune cells (e.g., T cells, e.g., B cells, e.g., macrophages). Moreover, a variety of frequencies and probes can be used at the same time to provide an integration detection system having a single source.

In one aspect, the invention is directed to a method of sample analysis, the method comprising: providing a sample comprising a hyperpolarized substance within a micro coil and exposing said sample and micro coil to a magnetic field; and detecting an NMR signal for the sample.

In certain embodiments, the method comprises metabolic imaging.

In certain embodiments, the sample comprises a member selected from the group consisting of a living sample and a non-living sample. In certain embodiments, the living sample comprises a biological sample. In certain embodiments, the biological samples comprises a member selected from the group consisting of a suspension of cells, a solid tissue sample, a porous structure encapsulating cells, a tumor organoid, biological cells, proteins and/or metabolites, bacteria, yeast, an enzymatic system, and blue/green algae. In certain embodiments, the non-living sample comprises a member selected from the group consisting of a synthetic cell system, a synthetic enzymatic system, and chemical molecules.

In certain embodiments, the method further comprises hyperpolarizing the sample. In certain embodiments, hyperpolarization is performed via Para-Hydrogen Induced Polarization (PHIP), Dynamic Nuclear Polarization (DNP), Spin-Exchange Optical Pumping, Parahydrogen Induced Polarization or other Gas-Induced Polarization. In certain embodiments, hyperpolarizing the sample comprises introducing a radical source. In certain embodiments, the radical source comprises a member selected from the group consisting of organic persistent free radicals, photo-induced non-persistent radicals, nanodiamonds or metabolites which can form temporary radicals, and silicon particles.

In certain embodiments, the hyperpolarized substance comprises an active nucleus (e.g., any NMR active nucleus). In certain embodiments, the active nucleus comprises a member selected from the group consisting of $^1$H, $^{13}$C, $^{31}$P, $^{15}$N, and $^{19}$F. In certain embodiments, the hyperpolarized substance comprises a member selected from the group consisting of hyperpolarized $^{13}$C-pyruvate, $^{13}$C-DHA, and $^{13}$C-VitC (Vitamin C), $^{13}$C-fructose, $^{13}$C-glucose, $^{13}$C-glutamine, $^{13}$C-serine, $^{13}$C-glycine, and $^{13}$C-acetate.

In certain embodiments, the biological cells comprise a quantity selected from the group consisting of no greater than 200 k cells, no greater than 150 k cells, no greater than 100 k cells, no greater than 50 k cells, no greater than 25 k cells, and no greater than 10 k cells.

In certain embodiments, the sample comprises a volume selected from the group consisting of no greater than 100 µL, no greater than 50 µL, no greater than 25 µL, no greater than 10 µL, no greater than 5 µL, and from about 1 to 3 µL.

In certain embodiments, the micro coil comprises a miniaturized radiofrequency (RF) coil.

In certain embodiments, the sample is placed within a chamber containing the micro coil, said micro coil surrounding the sample.

In certain embodiments, the magnetic field is from about 0.5 T to 7 T. In certain embodiments, the magnetic field is about 1 T.

In certain embodiments, the method comprises determining (e.g., by a processor of a computing device) metabolic data for the sample from the NMR signal. In certain embodiments, the method comprises determining metabolic flux.

In certain embodiments, the method comprises monitoring an enzymatic reaction rate. In certain embodiments, the enzymatic reaction rate is monitored at a rate less than 500 pmol/sec, less than 100 pmol/sec, less than 50 pmol/sec, or about 30 pmol/sec.

In certain embodiments, the method comprises, for each of a plurality of samples, placing said sample in a separate micro coil chamber or compartment, thereby enabling high throughput signal and/or metabolic data detection. In certain embodiments, the method comprises, placing each of the plurality of samples in its separate micro coil chamber or compartment using configurations of multiple (e.g., 2, 4, 8, 16, 48, 96, 192, 384, 1536, e.g., a high throughput platform) micro coils or micro coil portions. In certain embodiments, each micro coil or micro coil portion is surrounding a separate sample.

In certain embodiments, the micro coil has a diameter no greater than 5 mm, e.g., no greater than 3 mm, e.g., no greater than 2 mm, e.g., no greater than 1.5 mm, e.g., no greater than 1.0 mm, e.g., no greater than 0.5 mm. In certain embodiments, the micro coil has a diameter in a range from about 0.5 mm to about 2 mm. In certain embodiments, the micro coil has a diameter in a range from about 0.5 mm to about 1.5 mm.

In certain embodiments, the sample comprises cells from a tumor biopsy and/or cancer stem cells.

In certain embodiments, the method comprises determining metabolic data from the NMR signal, wherein the sample comprises cells acquired from a patient during surgery, and the determining of the metabolic data takes place within 10 minutes of acquisition of the cells. In certain embodiments, the surgery is brain surgery.

In certain embodiments, the determining of metabolic data takes place within 5 minutes, e.g., within 3 minutes, e.g., within 1 minute of acquisition of the cells. In certain embodiments, the method comprises intraoperative analysis of tissue sample obtained during surgery.

In certain embodiments, the sample comprises cells acquired from a subject following administration of a drug. In certain embodiments, the method comprises monitoring treatment efficacy.

In another aspect, the invention is directed to a hyperpolarized micro-NMR system comprising: a magnet for producing a magnetic field; a micro-coil chamber sized and shaped to contain a sample in suspension and a hyperpolarized substance; a first tuning circuit; a detector for detecting an NMR signal for the sample; and a processor of a computing device for executing instructions to determine metabolic data for the sample from the NMR signal.

In certain embodiments, the first tuning circuit is a tuning circuit for $^1$H.

In certain embodiments, the micro-NMR system comprises a second tuning circuit. In certain embodiments, the second tuning circuit is a tuning circuit for $^{13}$C.

In certain embodiments, the micro-NMR system comprises a mechanical switch. In certain embodiments, the mechanical switch selects the first tuning circuit. In certain embodiments, the mechanical switch selects the second tuning circuit.

In certain embodiments, the magnetic field is from about 0.5 T to 7 T. In certain embodiments, the magnetic field is about 1 T.

In certain embodiments, the processor of the computer device determines metabolic flux. In certain embodiments, the system monitors an enzymatic reaction rate. In certain embodiments, the enzymatic reaction rate is less than 500 pmol/sec, less than 100 pmol/sec, less than 50 pmol/sec, or about 30 pmol/sec.

In certain embodiments, the micro-NMR system is configured to perform any of the methods provided herein.

In certain embodiments, the micro coil has a diameter no greater than 5 mm, e.g., no greater than 3 mm, e.g., no greater than 2 mm, e.g., no greater than 1.5 mm, e.g., no greater than 1.0 mm, e.g., no greater than 0.5 mm. In certain embodiments, the micro coil has a diameter in a range from about 0.5 mm to about 2 mm. In certain embodiments, micro coil has a diameter in a range from about 0.5 mm to about 1.5 mm.

In certain embodiments, the system comprises a polarization module. In certain embodiments, the polarization module comprises a member selected from the group consisting of a Para-Hydrogen Induced Polarization (PHIP) module, a Dynamic Nuclear Polarization (DNP) module, a Spin-Exchange Optical Pumping module, a Parahydrogen Induced Polarization module, and other Gas-Induced Polarization module.

Elements of embodiments involving one aspect of the invention (e.g., methods) can be applied in embodiments involving other aspects of the invention (e.g., systems), and vice versa.

Definitions

In order for the present disclosure to be more readily understood, certain terms are first defined below. Additional definitions for the following terms and other terms are set forth throughout the specification.

In this application, the use of "or" means "and/or" unless stated otherwise. As used in this application, the term "comprise" and variations of the term, such as "comprising" and "comprises," are not intended to exclude other additives, components, integers or steps. As used in this application, the terms "about" and "approximately" are used as equivalents. Any numerals used in this application with or without about/approximately are meant to cover any normal fluctuations appreciated by one of ordinary skill in the relevant art. In certain embodiments, the term "approximately" or "about" refers to a range of values that fall within 25%, 20%, 19%, 18%, 17%, 16%, 15%, 14%, 13%, 12%, 11%, 10%, 9%, 8%, 7%, 6%, 5%, 4%, 3%, 2%, 1%, or less in either direction (greater than or less than) of the stated reference value unless otherwise stated or otherwise evident from the context (except where such number would exceed 100% of a possible value).

"Biocompatible": The term "biocompatible", as used herein is intended to describe materials that do not elicit a substantial detrimental response in vivo. In certain embodiments, the materials are "biocompatible" if they are not toxic to cells. In certain embodiments, materials are "biocompatible" if their addition to cells in vitro results in less than or equal to 20% cell death, and/or their administration in vivo does not induce inflammation or other such adverse effects. In certain embodiments, materials are biodegradable.

"Biological Sample": As used herein, the term "biological sample" typically refers to a sample obtained or derived from a biological source (e.g., a tissue or organism or cell culture) of interest, as described herein. In certain embodiments, a source of interest comprises an organism, such as an animal or human. In certain embodiments, a biological sample is or comprises biological tissue or fluid. In certain embodiments, a biological sample may be or comprise bone marrow; blood; blood cells; ascites; tissue or fine needle biopsy samples; cell-containing body fluids; free floating nucleic acids; sputum; saliva; urine; cerebrospinal fluid, peritoneal fluid; pleural fluid; feces; lymph; gynecological fluids; skin swabs; vaginal swabs; oral swabs; nasal swabs; washings or lavages such as a ductal lavages or bronchioalveolar lavages; aspirates; scrapings; bone marrow specimens; tissue biopsy specimens; surgical specimens; feces, other body fluids, secretions, and/or excretions; and/or cells therefrom, etc. In certain embodiments, a biological sample is or comprises cells obtained from an individual. In certain embodiments, obtained cells are or include cells from an individual from whom the sample is obtained. In certain embodiments, a sample is a "primary sample" obtained directly from a source of interest by any appropriate means. For example, in certain embodiments, a primary biological sample is obtained by methods selected from the group consisting of biopsy (e.g., fine needle aspiration or tissue biopsy), surgery, collection of body fluid (e.g., blood, lymph, feces etc.), etc. In certain embodiments, as will be clear from context, the term "sample" refers to a preparation that is obtained by processing (e.g., by removing one or more components of and/or by adding one or more agents to) a primary sample. For example, filtering using a semi-permeable membrane. Such a "processed sample" may comprise, for example nucleic acids or proteins extracted from a sample or obtained by subjecting a primary sample to techniques such as amplification or reverse transcription of mRNA, isolation and/or purification of certain components, etc.

"Cancer": As used herein, the term "cancer" refers to a disease, disorder, or condition in which cells exhibit relatively abnormal, uncontrolled, and/or autonomous growth, so that they display an abnormally elevated proliferation rate and/or aberrant growth phenotype characterized by a significant loss of control of cell proliferation. In certain embodiments, a cancer may be characterized by one or more tumors. Those skilled in the art are aware of a variety of types of cancer including, for example, adrenocortical carcinoma, astrocytoma, basal cell carcinoma, carcinoid, cardiac, cholangiocarcinoma, chordoma, chronic myeloproliferative neoplasms, craniopharyngioma, ductal carcinoma in situ, ependymoma, intraocular melanoma, gastrointestinal carcinoid tumor, gastrointestinal stromal tumor (GIST), gestational trophoblastic disease, glioma, histiocytosis, leukemia (e.g., acute lymphoblastic leukemia (ALL), acute myeloid leukemia (AML), chronic lymphocytic leukemia (CLL), chronic myelogenous leukemia (CML), hairy cell leukemia, myelogenous leukemia, myeloid leukemia), lymphoma (e.g., Burkitt lymphoma [non-Hodgkin lymphoma], cutaneous T-cell lymphoma, Hodgkin lymphoma, mycosis fungoides, Sezary syndrome, AIDS-related lymphoma, follicular lymphoma, diffuse large B-cell lymphoma), melanoma, merkel cell carcinoma, mesothelioma, myeloma (e.g., multiple myeloma), myelodysplastic syndrome, papillomatosis, paraganglioma, pheochromocytoma, pleuropulmonary blastoma, retinoblastoma, sarcoma (e.g., Ewing sarcoma, Kaposi sarcoma, osteosarcoma, rhabdomyosarcoma, uterine sarcoma, vascular sarcoma), Wilms' tumor, and/or cancer of the adrenal cortex, anus, appendix, bile duct, bladder, bone, brain, breast, bronchus, central nervous system, cervix, colon, endometrium, esophagus, eye, fallopian tube, gall bladder, gastrointestinal tract, germ cell, head and neck, heart, intestine, kidney (e.g., Wilms' tumor), larynx, liver, lung (e.g., non-small cell lung cancer, small cell lung cancer), mouth, nasal cavity, oral cavity, ovary, pancreas, rectum, skin, stomach, testes, throat, thyroid, penis, pharynx, peritoneum, pituitary, prostate, rectum, salivary gland, ureter, urethra, uterus, vagina, or vulva.

"Detector": As used herein, the term "detector" includes any detector of electromagnetic radiation including, but not limited to, a radiofrequency detector (e.g., radiofrequency antenna (e.g., a solenoid antenna) (e.g., Helmholtz pairs, e.g., microslot planar detector) EMCCD camera, CMOS camera, photomultiplier tubes, photodiodes, and avalanche photodiodes.

"Hyperpolarized" or "Hyperpolarized substance": As used herein, the term "hyperpolarized" or "hyperpolarized substance" refers to a substance having a nuclear magnetic resonance (NMR) active nucleus which has a polarization significantly above its Boltzmann distribution at a given magnetic field strength. For example, $^{13}C$ is polarized at 2.8 ppm (or $2.8 \times 10^{-6}$ polarized) at 3 Tesla (30,000 Gauss). In hyperpolarized experiments described herein, dissolution DNP was used to hyperpolarize $^{13}C$ to 0.28 ppm which would be an enhancement of about 100,000-fold at 3 Tesla.

"Therapeutic regimen": A "therapeutic regimen", as that term is used herein, refers to a dosing regimen whose administration across a relevant population may be correlated with a desired or beneficial therapeutic outcome.

"Sample": As used herein, the term "sample" typically refers to an aliquot of material obtained or derived from a source of interest, as described herein. In certain embodiments, a source of interest is a biological or environmental source. In certain embodiments, a source of interest may be or comprise a cell or an organism, such as a microbe, a plant, or an animal (e.g., a human). In certain embodiments, a source of interest is or comprises biological tissue or fluid (e.g., an in vivo sample or an ex vivo sample). In certain embodiments, a biological tissue or fluid may be or comprise amniotic fluid, aqueous humor, ascites, bile, bone marrow, blood, breast milk, cerebrospinal fluid, cerumen, chyle, chime, ejaculate, endolymph, exudate, feces, gastric acid, gastric juice, lymph, mucus, pericardial fluid, perilymph, peritoneal fluid, pleural fluid, pus, rheum, saliva, sebum, semen, serum, smegma, sputum, synovial fluid, sweat, tears, urine, vaginal secretions, vitreous humour, vomit, and/or combinations or component(s) thereof. In certain embodiments, a biological fluid may be or comprise an intracellular fluid, an extracellular fluid, an intravascular fluid (blood plasma), an interstitial fluid, a lymphatic fluid, and/or a transcellular fluid. In certain embodiments, a biological fluid may be or comprise a plant exudate. In certain embodiments, a biological tissue or sample may be obtained, for example, by aspirate, biopsy (e.g., fine needle or tissue biopsy), swab (e.g., oral, nasal, skin, or vaginal swab), scraping, surgery, washing or lavage (e.g., brocheoalvealar, ductal, nasal, ocular, oral, uterine, vaginal, or other washing or lavage). In certain embodiments, a biological sample is or comprises cells obtained from an individual. In certain embodiments, a sample is a "primary sample" obtained directly from a source of interest by any appropriate means. In certain embodiments, as will be clear from context, the term "sample" refers to a preparation that is obtained by processing (e.g., by removing one or more components of and/or by adding one or more agents to) a primary sample. For example, filtering using a semi-permeable membrane. Such a "processed sample" may comprise, for example nucleic acids or proteins extracted from a sample or obtained by subjecting a primary sample to one or more techniques such as amplification or reverse transcription of nucleic acid, isolation and/or purification of certain components, etc. In certain embodiments, the sample is a non-living sample (e.g., a synthetic cell system, e.g., a synthetic enzymatic system, e.g., a chemical composition, e.g., a petroleum sample).

"Substantially": As used herein, the term "substantially", and grammatical equivalents, refer to the qualitative condition of exhibiting total or near-total extent or degree of a characteristic or property of interest. One of ordinary skill in the art will understand that biological and chemical phenomena rarely, if ever, go to completion and/or proceed to completeness or achieve or avoid an absolute result.

"Subject": As used herein, the term "subject" includes humans and mammals (e.g., mice, rats, pigs, cats, dogs, and horses). In many embodiments, subjects are mammals, particularly primates, especially humans. In certain embodiments, subjects are livestock such as cattle, sheep, goats, cows, swine, and the like; poultry such as chickens, ducks, geese, turkeys, and the like; and domesticated animals particularly pets such as dogs and cats. In certain embodiments (e.g., particularly in research contexts) subject mammals will be, for example, rodents (e.g., mice, rats, hamsters), rabbits, primates, or swine such as inbred pigs and the like.

"Therapeutic agent": As used herein, the phrase "therapeutic agent" refers to any agent that has a therapeutic effect and/or elicits a desired biological and/or pharmacological effect, when administered to a subject.

"Treatment": As used herein, the term "treatment" (also "treat" or "treating") refers to any administration of a substance that partially or completely alleviates, ameliorates, relieves, inhibits, delays onset of, reduces severity of, and/or reduces incidence of one or more symptoms, features, and/or causes of a particular disease, disorder, and/or condition. Such treatment may be of a subject who does not exhibit signs of the relevant disease, disorder and/or condition and/or of a subject who exhibits only early signs of the disease, disorder, and/or condition. Alternatively or additionally, such treatment may be of a subject who exhibits one or more established signs of the relevant disease, disorder and/or condition. In certain embodiments, treatment may be of a subject who has been diagnosed as suffering from the relevant disease, disorder, and/or condition. In certain embodiments, treatment may be of a subject known to have one or more susceptibility factors that are statistically correlated with increased risk of development of the relevant disease, disorder, and/or condition. In certain embodiments, treatment comprises delivery of therapeutics, including but not limited to, small molecule delivery, radiotherapy, immunotherapy, intrinsic therapeutic properties (e.g., ferroptosis), and particle-driven regulation of the tumor microenvironment. In certain embodiments, therapeutics are attached to particles, such as those described herein.

Drawings are presented herein for illustration purposes, not for limitation.

BRIEF DESCRIPTION OF DRAWINGS

The foregoing and other objects, aspects, features, and advantages of the present disclosure will become more apparent and better understood by referring to the following description taken in conduction with the accompanying drawings, in which:

FIG. 1A shows a schematic of glycolytic metabolism in cancer and normal cells, according to an illustrative embodiment of the invention.

FIG. 1B shows a schematic of an HMRS assay, according to an illustrative embodiment of the invention. $^{13}C$-enriched pyruvate is hyperpolarized and mixed with cell suspension. Once the suspension is loaded into the micro-coil, $^{13}C$ NMR acquisition starts in a 1.05 Tesla magnetic field.

FIG. 1C shows an optical picture of the micro-coil probe in the HMRS, according to an illustrative embodiment of the invention. The mechanical switch was used for changing the resonance mode of the micro-coil. Inset shows the micro-coil embedded in a PDMS block. Net volume inside the coil is 2 μL.

FIG. 2A shows NMR spectra of hyperpolarized metabolites from 50,000 UOK262 cells. Each spectrum was acquired every four seconds with a 30° radio-frequency pulse. Lac, lactate; Pyr-H, pyruvate hydrate; Pyr, pyruvate.

FIG. 2B shows a plot of the NMR signals of pyruvate and lactate peaks shown in FIG. 2A. Each signal was quantified from the integral of each area.

FIG. 2C shows a plot of the ratio of lactate signal to total signal (sum of pyruvate, pyruvate hydrate, and lactate signal) with time. All measurements were performed in duplicate. Error bars show the standard deviation.

FIGS. 3A-3D show sensitive and non-destructive analysis of glycolytic flux with HMRS.

FIG. 3A shows titration data of the flux metric of UOK262 cells.

FIG. 3B shows profiling of the flux metric in five different cell lines. UOK262 (kidney cancer), U87 (glioblastoma), Jurkat (acute T-cell leukemia), K562 (chronic myeloid leukemia), and HK-2 (kidney).

FIG. 3C shows NMR spectra of hyperpolarized metabolites acquired from malignant cancer cells (UOK262) and nonmalignant ones (HK-2). $10^5$ cells were used for each HMRS assay.

FIG. 3D shows a comparison of viability before and after HMRS assays. Two cancer cell lines (K562 and UOK262) were tested. The "Before" measurement was conducted 15 minutes before the HMRS assay, and the "After" measurement was conducted 15 minutes after the HMRS assay. All measurements were performed in duplicate. Error bars show the standard deviation.

FIG. 4A shows a representative plot of flow cytometry of leukemia cells from a mouse with MLL-AF9 AML. The leukemia cells, collected from a mouse bone marrow, were sorted using the gates indicated in the plot.

FIG. 4B shows median fluorescence intensity of c-Kit in the leukemia stem cells (c-Kit$^{Hi}$) and leukemia non-stem cells)(c-Kit$^{Lo}$) after 20 hours in media.

FIG. 4C shows profiling of the flux metric in the leukemia cells.

FIGS. 5A-5G show rapid assessment of drug treatment response with HMRS.

FIG. 5A shows measurement of K562 cell counts after imatinib (GLEEVEC) treatment.

FIG. 5B shows viability of K562 cells after 24 hours of treatment.

FIG. 5C show NMR spectra of hyperpolarized metabolites acquired by the HMRS after 24 hours of treatment.

FIG. 5D shows a plot of normalized metric $\xi/\xi_0$ after treatment. The metric $\xi_0$ was calculated from non-treated K562 cells (control).

FIG. 5E shows a schematic of metabolic analysis with different treatment durations. The dose of imatinib was set to 1 µM.

FIG. 5F shows a plot of normalized metric with different durations. The metric was calculated from non-treated K562 cells (duration was 0 hour).

FIG. 5G shows a plot of normalized lactate concentrations from cell culture media with different durations. Each lactate signal was acquired by a conventional high-field NMR spectrometer. All measurements were performed in triplicate. Error bars show the standard deviation.

FIGS. 6A-6E show HMRS integrated with a microfluidic system for multiple analyses, according to an illustrative embodiment of the invention.

FIG. 6A shows a schematic of the integrated HMRS platform, according to an illustrative embodiment of the invention. FIG. 6A shows a tuning/matching circuit for $^1$H, a mechanical switch, and a tuning/matching circuit for $^{13}$C. The mechanical switch is designed for selecting the tuning/matching circuit between $^1$H and $^{13}$C.

FIG. 6B shows an assay schematic, according to an illustrative embodiment of the invention.

FIG. 6C shows sequential spectra of hyperpolarized pyruvate collected from multiple analyses.

FIG. 6D shows quantification and comparison of NMR signals from 12 analyses. NMR signal in each analysis (I) was normalized by the first signal of the same analysis ($I_0$). All data sets were fitted to a single model of decay of hyperpolarized spin states. The 12 analyses yielded $R_2$ of 99.5±0.4% and root-mean-square-error (RMSE) of 3.07±1.05%.

FIG. 6E shows multiple analyses of glycolytic flux from a single dissolution of hyperpolarized pyruvate. Each analysis consists of five NMR acquisitions (15 seconds in total), followed by a 15-second interval to stabilize the sample after movement. The overall glycolytic flux metric ξ was 34.69 (pmol/sec) per $10^5$ cells, which was well matched to the ξ of K562 (33.24±2.51) presented in FIG. 3B. The measurements were performed in triplicate. Error bars show the standard deviation.

FIG. 8A shows a plot of NMR spectra of hyperpolarized metabolites in 50,000 UOK262 cells. This is an extended plot of FIG. 2A.

FIG. 8B shows a comparison of the pyruvate signal plotted in FIG. 8A with the simulated data. The simulation was conducted with an assumption that there was no metabolic reaction during the measurement. The simulated data models a spin-lattice relaxation decay with a relaxation constant $T_1$ of pyruvate (70 sec).

FIG. 8C shows a comparison of the lactate signal plotted in FIG. 8A with the simulated data. The simulation was conducted with an assumption that there was no metabolic reaction during the measurement. The simulated data models a spin-lattice relaxation decay with a relaxation constant $T_1$ of lactate (40 sec).

FIG. 9 shows a mathematical analysis of the increase rate of lactate relative to total carbon (lactate+pyruvate+pyruvate hydrate) with time. The variation of hyperpolarized signal levels (dPyr/dt or dLac/dt) can be described by a simplified mathematical model. In this model, the variation is dependent on the conversion rate constant ($k_{PL}$ or $k_{Lp}$) and the spin-lattice relaxation time ($T_{pyr}$ or $T_{Lac}$). Because the ratio of the pyruvate hydrate level to the pyruvate level is constant under the same pH condition, it can be assumed that (Lac+Pyr+Pyr-H)≈(Lac+Pyr). Because the pyruvate signal level is significantly larger than the lactate level, it can be assumed that (Lac/Pyr)<<1. In this model, the increase rate of lactate relative to total carbon can be derived as a constant, $k_{PL}$. Lac, lactate; Pyr, pyruvate; Pyr-H, pyruvate hydrate.

FIG. 16A shows real-time analysis of cancer metabolism with hyperpolarized $^{13}$C-pyruvate. The left image shows a T2-weighted MRI image of a GIST (gastrointestinal stromal tumor) mouse xenograft. Dotted lines indicate the tumor region. The center image shows a hyperpolarized NMR spectra from kidney (top), tumor (middle), and muscle (bottom). The spectrum from the tumor is significantly different than the spectra from kidney and muscle. The right image shows a false-color image demonstrating the higher levels of lactate in the tumor region.

FIG. 21 also depicts mathematical formulations describing how the size of a coil affects signal-to-noise ratio.

DETAILED DESCRIPTION

Figure 1A:
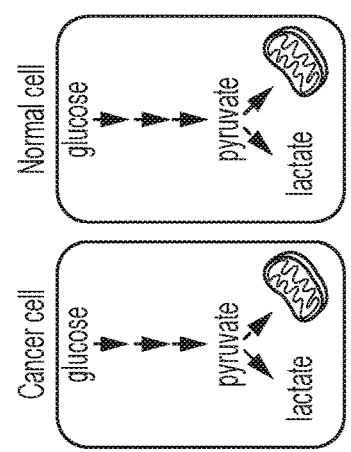
FIGS. 1A-1C show a hyperpolarized micromagnetic resonance spectrometer (HMRS) platform, according to an illustrative embodiment of the invention.

Throughout the description, where compositions are described as having, including, or comprising specific components, or where methods are described as having, including, or comprising specific steps, it is contemplated that, additionally, there are compositions of the present invention that consist essentially of, or consist of, the recited components, and that there are methods according to the present invention that consist essentially of, or consist of, the recited processing steps.

It should be understood that the order of steps or order for performing certain action is immaterial so long as the invention remains operable. Moreover, two or more steps or actions may be conducted simultaneously.

The mention herein of any publication, for example, in the Background section, is not an admission that the publication serves as prior art with respect to any of the claims presented herein. The Background section is presented for purposes of clarity and is not meant as a description of prior art with respect to any claim.

Described herein is a rapid and sensitive NMR platform designed for metabolic flux analysis on a small number of cells. Termed "hyperpolarized micromagnetic resonance spectrometer (HMRS)", in certain embodiments, the system is (i) equipped with a dual-tuned micro-coil circuit for sensitive detection of $^{13}$C molecules, (ii) optimized to process a small mass of biological sample, and (iii) integrated with a microfluidic system for high-throughput analysis. The HMRS system can quantify glycolytic flux with 1000-fold higher sensitivity than conventional DNP-NMR approaches. This system was used to quantify metabolic flux in leukemia stem cells in vitro and to assess drug treatment response before any changes in cell viability or proliferation has occurred. Furthermore, the platform analyzed more than 10 samples of hyperpolarized molecules in one experiment demonstrating improved features compared to other systems that are used to study metabolic flux.

Aerobic glycolysis or 'Warburg effect' is a unique metabolic feature of cancer cells, closely related to multiple oncogenic signaling pathways. As the glycolytic flux represents the activity of the major metabolic pathway at any given moment, it has emerged as a potent biomarker for cancer diagnosis and treatment response monitoring. There has been a great need for methods that could perform rapid flux analyses in mass-limited samples, including cancer stem cells, and the HMRS system presented herein presents a solution for methods that could perform rapid flux analyses in mass-limited samples.

The developed HMRS system has several advantages over conventional techniques for metabolic flux analysis. First, the detection modality of the provided system is based on magnetic resonance, which makes a flux analysis completely non-destructive, thereby allowing repeated measurements as well as downstream molecular analyses using other techniques. Second, a miniaturized detection coil of the provided system increases the filling-factor of the target molecules and enhances the sensitivity. Third, by exploiting hyperpolarization techniques such as DNP hyperpolarization techniques, the provided system monitors metabolic reactions in real-time without any signal averaging. Fourth, the provided system can perform multiple analyses with an integrated microfluidic system, enabling the high-throughput system for analyzing hyperpolarized molecules as well as the potential to integrate this platform into other high-throughput approaches.

Based on at least these technical advantages, the HMRS platform quantitatively profiled metabolic fluxes in leukemia stem cells and assessed therapeutic responses in cancer cells much earlier than any changes in viability, hardly achievable using conventional methods. The present disclosure provides surprising opportunities for stem cell research where rapid and sensitive analytical capabilities are critical. Moreover, the provided disclosure can be used to investigate how stem cells metabolically respond to external stimuli, such as drug treatment.

Further studies with drugs targeting metabolic differences in leukemia stem cells and hematopoietic stem cells can lead to more effective therapeutic strategies to cure cancer. The HMRS platform can also be applicable for rapid metabolic flux analysis in clinically relevant samples, such as biopsy specimens or patient-derived organoids, in a continuous manner to assess treatment response.

Other features can advance the HMRS system. For the analysis of different metabolic pathways, hyperpolarization of metabolites other than pyruvate can be readily applied to the HMRS. For the analysis of smaller number of cells, there are multiple strategies.

First, a smaller coil for NMR signal acquisition can be implemented. A coil with a diameter of less than 1.4 mm can provide a higher sensitivity; however, precise loading of sample into a sub-microliter space within a limited time frame is not trivial. One strategy to overcome this challenge is to integrate a micro pneumatic actuator into the HMRS, which moves liquid sample rapidly and precisely into a micro-coil;

Second, high-order shimming coils can be designed to make a magnetic field more homogeneous. In certain embodiments, provided system are equipped with first-order shimming coils, which provided a limited homogeneity of magnetic field (0.14-ppm FWHM) in the micro-coil circuit region. Since the NMR signal is proportional to the number of target nuclei experiencing the same magnetic field, more homogenous magnetic field leads to narrower NMR peaks and a higher SNR. Adding second- and third-order shimming coils into the permanent magnet can improve the homogeneity of magnetic field, thereby leading to the enhanced sensitivity of the HMRS.

Third, a selective RF pulse can be applied for signal acquisition. In certain embodiments, the provided system acquired the NMR spectra using a single RF pulse, which excited all the metabolic substrates and products at the same time. A selective pulse designed to only excite the products (e.g., lactate) can leave the hyperpolarized spin states of substrates (e.g., pyruvate) relatively intact. The benefit of slowly-decaying hyperpolarized substrates allows flux analysis for extended periods of time, providing an opportunity to monitor multiple metabolic pathways.

The HMRS platform provides opportunities for rapid and sensitive exploration of metabolic dynamics in biologically relevant systems.

Applications of Hyperpolarized NMR

In certain embodiments, hyperpolarized NMR is used for intra-operative tissue analysis. For example, during brain surgery, a tumor biopsy sample is analyzed by frozen sectioning, which take from about 20 to about 30 minutes. Hyperpolarized NMR allows for metabolic information of biopsy samples to be analyzed within a minute before frozen sectioning. Metabolic dynamics in about 50,000 cells in suspension are analyzed. In certain embodiments, the provided systems and methods are modified such that that solid tissue samples can be analyzed.

In certain embodiments, hyperpolarized NMR is used for treatment efficacy monitoring after drug treatment. For example, characterization of leukemia cells might take a couple of hours or days. Hyperpolarized NMR allows for metabolic information after treatment to be analyzed within a minute before FACS, Western blot, or PCT, for example. As described herein, analysis of tyrosine kinase inhibitor (TKI) was studied to determine its effect on metabolism. In certain embodiments, the provided systems and methods can be used for other TKI treatments (e.g., ibrutinib for CLL).

Conventional hyperpolarized NMR systems require more than tens of millions of cells. By contrast, the present disclosure provides for hyperpolarized micro-NMR systems that can analyze a small number of cells.

Identification of Targets and Therapeutic Treatment

The present disclosure describes hyperpolarized micro-NMR systems and methods for identifying a variety of drug targets in metabolic pathways (e.g., for early-stage discovery). In certain embodiments, the disclosed systems and methods facilitate high-throughput screening of various compounds involved in metabolic pathways.

Moreover, the disclosed systems and methods can direct a therapeutic regimen based on efficacy monitoring and can support therapeutic development by identifying points of intervention (e.g., targets) that correspond to metabolic differences. For example, hyperpolarized micro-NMR can profile metabolic characteristics in a small number of cells (e.g., no greater than 200 k cells, no greater than 150 k cells, no greater than 100 k cells, no greater than 50 k cells, no greater than 25 k cells, or no greater than 10 k cells). Accordingly, the disclosed systems and methods provide the ability to investigate heterogeneity of a tumor from a patient, thereby revealing effective therapeutic efficacy. This cannot be achieved by systems that profile metabolic characteristics over only a large number of cells, e.g., systems with resolution requiring signal averaging over large numbers of cells.

Drugs can target a variety of metabolic pathways, for example, metabolic pathways in cancer and metabolic pathways in non-cancerous diseases and other conditions, such as metabolic pathways in diabetes and in fatty liver disease.

Drugs can also change in the endogenous metabolism of the cell. In certain embodiments, the drug can be hyperpolarized, and its metabolic product in the cell is detected and quantified.

For example, drugs can include receptor tyrosine kinase inhibitors and metabolic enzyme inhibitors (e.g., IDHi, e.g., LDHi, e.g., DCA for PDHK), imatinib (e.g., for chronic myelogenous leukemia (CIVIL), e.g., for acute lymphoblastic leukemia (ALL), e.g., for gastrointestinal stromal tumor (GIST)), rapamycin (e.g., for kidney cancer), enasidenib, an epidermal growth factor receptor (EGFR)-targeting tyrosine kinase inhibitor (e.g., Erlotinib (e.g., for lung cancer)), a BCR-ABL tyrosine kinase inhibitor (e.g., Erlotinib (e.g., for lung cancer)), a PI3K inhibitor (e.g., Idelalisib (e.g., for CLL)), a FLT3-ITD tyrosine kinase inhibitor (e.g., Quizartinib (e.g., for AML)), an inhibitor of PDK (e.g., Dichloroacetate (DCA)), an indirect inhibitor of mTORC1 (e.g., Metformin (e.g., for pancreatic cancer)), and P450.

EXAMPLES

Hyperpolarized Micromagnetic Resonance Spectrometer

Figure 7:
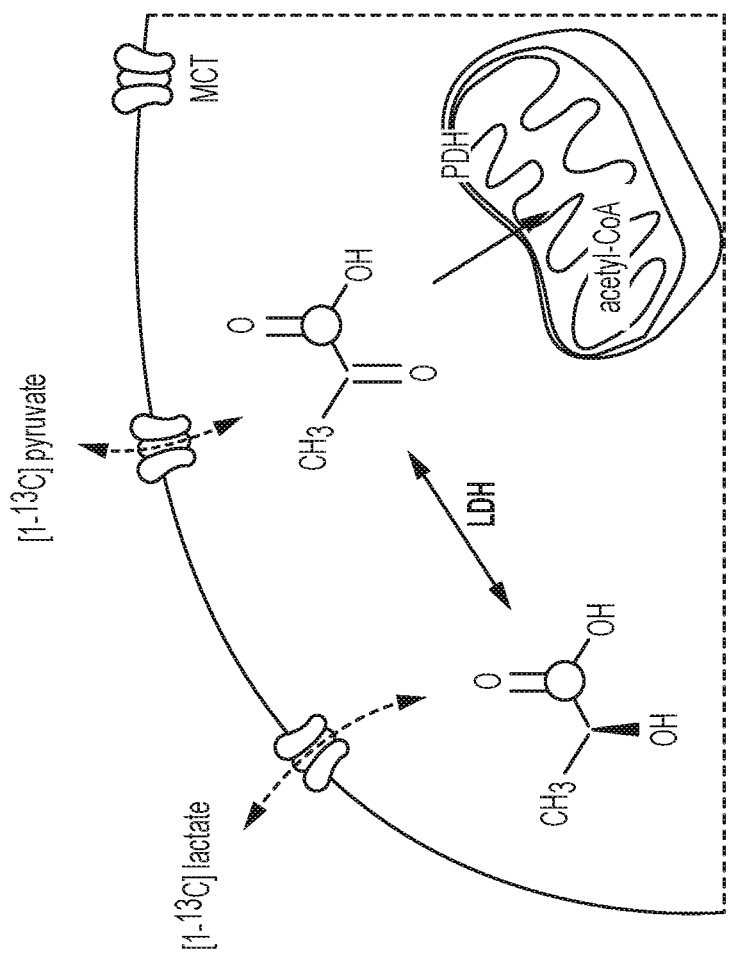
FIG. 7 shows a schematic of [1-$^{13}$C] pyruvate metabolism in cells. The circle indicates $^{13}$C in pyruvate and lactate. When [1-$^{13}$C] pyruvate is converted to lactate, the 13C stays in the same carboxyl group (COOH). Pyruvate and lactate is imported/exported through MCTs. LDH, lactate dehydrogenase; PDH, pyruvate dehydrogenase; MCT, monocarboxylate transporter.

FIG. 1A illustrates the fundamental difference in glycolytic metabolism between cancer and normal cells. Pyruvate, a 3-carbon intermediate product of glycolysis, is predominantly converted to lactate by lactate dehydrogenase (LDH, EC 1.1.2.4) in the cytoplasm or to acetyl-CoA by pyruvate dehydrogenase (PDH, EC 1.2.4.1) in the mitochondria. LDH is typically overexpressed in cancer cells, which drives the conversion from pyruvate to lactate. In normal cells, pyruvate is oxidized to a greater degree and used for ATP generation in the mitochondria. When [1-$^{13}$C] pyruvate enters into cells directly through the monocarboxylate transporters (MCTs), it enters in the intracellular pool of pyruvate and is metabolized, producing higher [1-$^{13}$C] lactate in cancer cells as compared to normal cells (FIGS. 1A and 7). Hyperpolarization of [1-$^{13}$C] pyruvate then provides a means of probing this last step of glycolysis non-invasively with a dramatic MR signal enhancement.

Figure 1B:
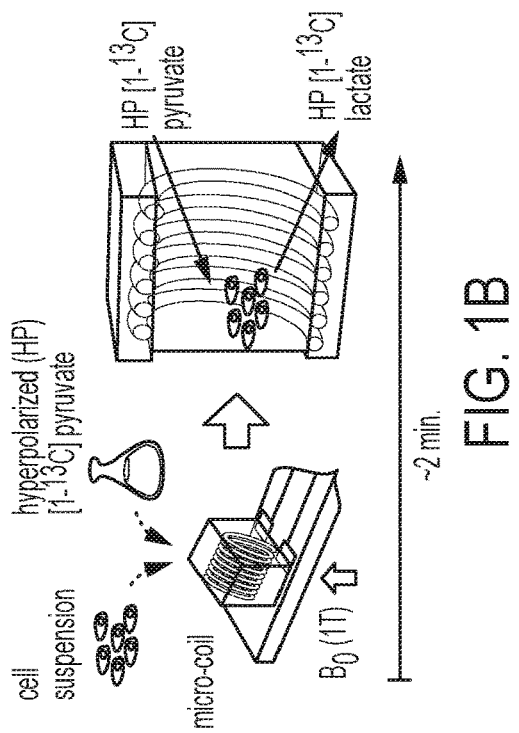
Figure 1C:
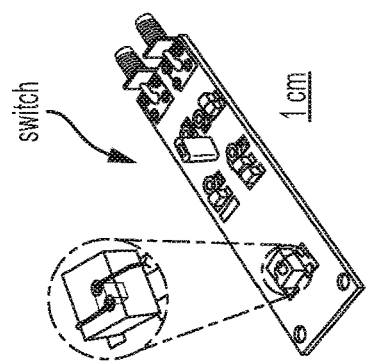

FIG. 1B shows the HMRS assay scheme. Samples (cell suspension) are mixed with hyperpolarized [1-$^{13}$C] pyruvate and then loaded into the micro-coil (1.4-mm diameter, 2-volume) in the HMRS system (FIG. 1C). The HMRS system acquires NMR signals of pyruvate and lactate in a 1.05 Tesla ($B_0$) permanent magnet (nanoScan, Mediso). Because pyruvate and lactate have relatively long spin-lattice relaxation times, T1, at 1.05 Telsa (71 and 43 seconds, respectively), the hyperpolarization states of these molecules do not decay significantly during the metabolic reactions and signal acquisition. It is important to note that the whole process of analyzing metabolic flux is completed within two minutes (FIG. 1B). The micro-coil probe circuit was implemented to resonate at the Larmor frequencies of $^1$H and $^{13}$C in our permanent magnet (44.69 and 11.24 MHz, respectively). A permanent magnet, in general, provides a cost-effective solution for MR research, but it suffers from temporal and spatial inhomogeneity of a magnetic field. These problems were addressed with the $^1$H resonance mode in the micro-coil; the drift and inhomogeneity were diagnosed and calibrated with first-order shimming in the $^1$H resonance mode. The resonance mode was then switched from $^1$H mode to $^{13}$C mode immediately before $^{13}$C NMR experiments (FIG. 1C).

Figure 2C:
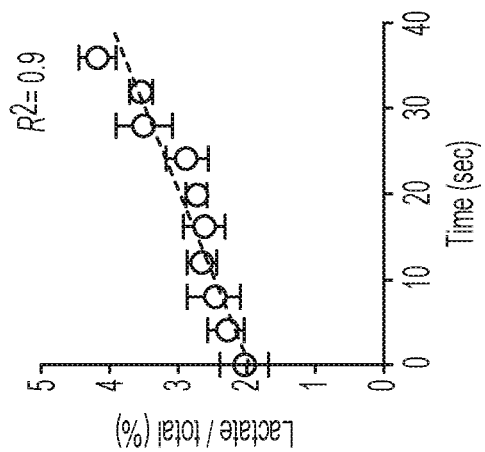
FIGS. 2A-2C show analysis of metabolic flux using HMRS.
Figure 2B:
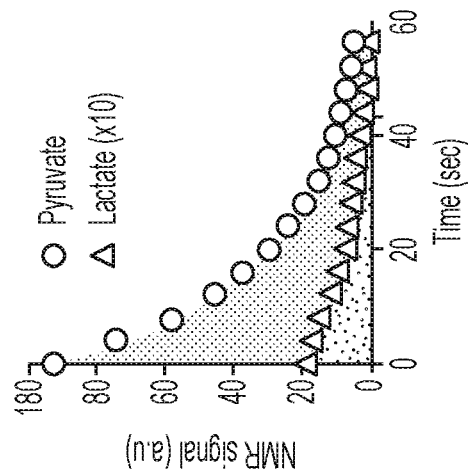
Figure 2A:
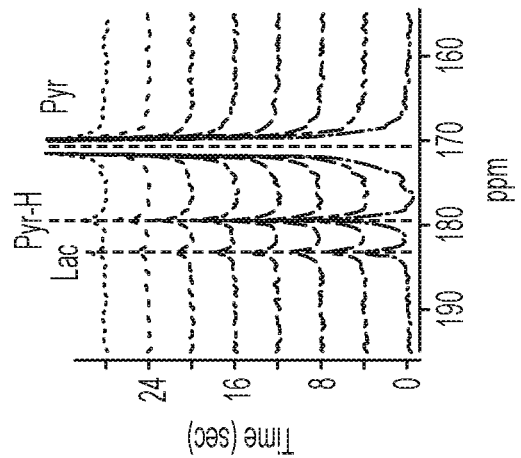
Figure 8A:
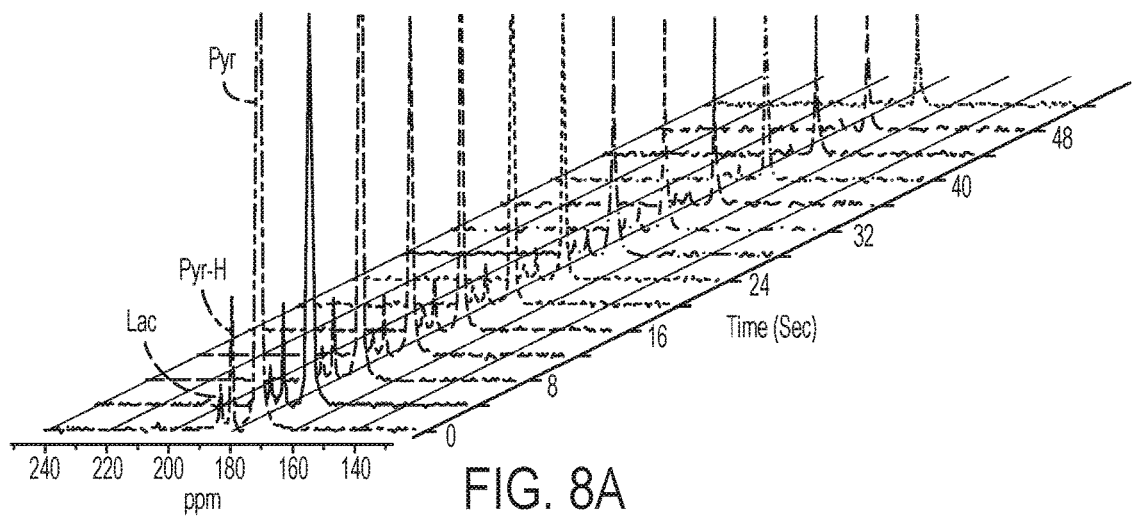
FIGS. 8A-8C show metabolic flux measurements using the HMRS.
Figure 8B:
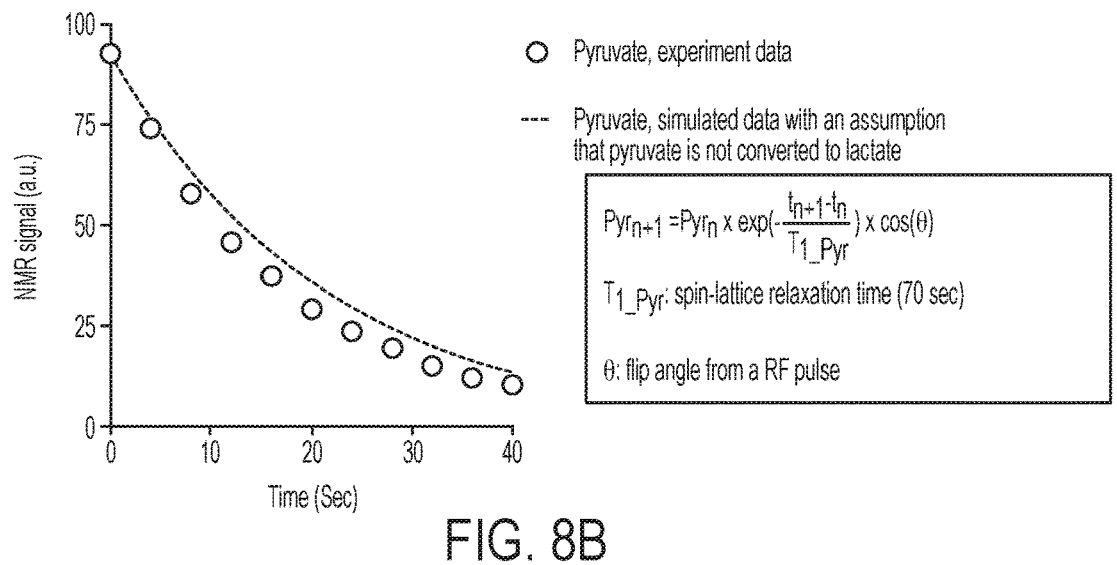
Figure 8C:
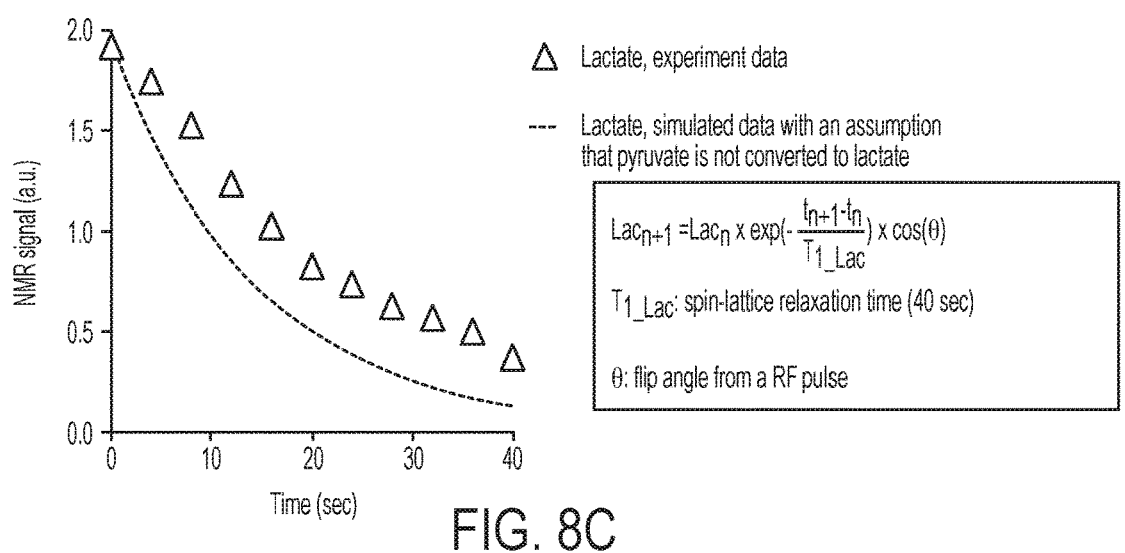

The HMRS system acquired NMR spectra every four seconds with a 30° RF pulse and quantified them based on the peak area. Utilizing 50,000 UOK262 cells (a renal cell carcinoma), it was observed that the lactate peak was detected from the first NMR spectrum and its signal level increased relative to pyruvate with time (FIGS. 2A and 2B). Considering that lactate has a shorter $T_1$ than pyruvate, the relative increase of lactate indicated that the cells inside the micro-coil were consuming pyruvate and producing lactate during the measurement (FIGS. 8A-8C).

Because the $^{13}$C NMR signal of pyruvate is significantly larger than those of lactate and pyruvate hydrate, the increase rate of $^{13}$C lactate signal relative to $^{13}$C total signal(pyruvate+pyruvate hydrate+lactate) can be equivalent to the conversion rate constant of pyruvate to lactate, $k_{PL}$ (FIG. 9). The overall conversion rate from pyruvate to lactate in the HMRS assay, therefore, can be assumed to be the product of kPL and the initial amount of pyruvate, [Pyr]t=0, loaded into the system (=28×10−9 mol). The overall conversion rate (kPL×[Pyr]t=0) was defined as a metabolic flux metric ξ.

Analysis of Metabolic Flux in Live Cells with 1000-Fold Higher Sensitivity

Figure 10:
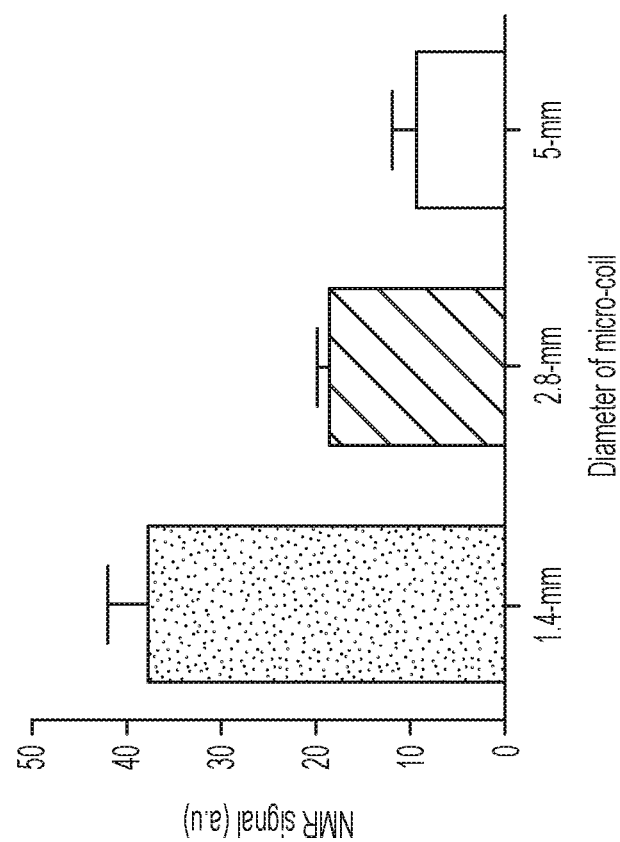
FIG. 10 shows a comparison of NMR signals from three different coils. All the micro-coils had the same length, 1.3 mm. In each micro-coil, 28 μmol of [1-$^{13}$C] pyruvic acid was loaded for the experiments. NMR experiments were conducted with the following parameters: the number of 90° pulses, 20; the repetition time between pulses, 4 sec. All measurements were performed in duplicate.

In order to assess the sensitivity of the described approach, titration experiments were performed with UOK262 cells, demonstrating detection sensitivity down to $10^4$ cancer cells with a linear response to cell numbers ($R_2$>99%, FIG. 3A). Conventional hyperpolarized NMR techniques typically require much larger number of cells (>$10^7$) for metabolic flux analysis, whereas the HMRS platform required on the order of $10^4$ cells of interest. This 1000-fold higher sensitivity is one of the key advantages of the HMRS system, which was achieved, for example, with the miniaturization of the coil design. The signal-to-noise ratio (SNR) of NMR signals depends on the magnetic field induced by unit current flowing through the coil, thus a smaller coil generates a higher SNR than a larger one with the same amount of target molecules (FIG. 10). Another contributing factor for a higher SNR is the filling factor of the target molecule. The described micro-coil, embedded into a polymer block, allowed the sample to fill the entire coil, maximizing the filling-factor 1) for NMR detection.

Figure 11:
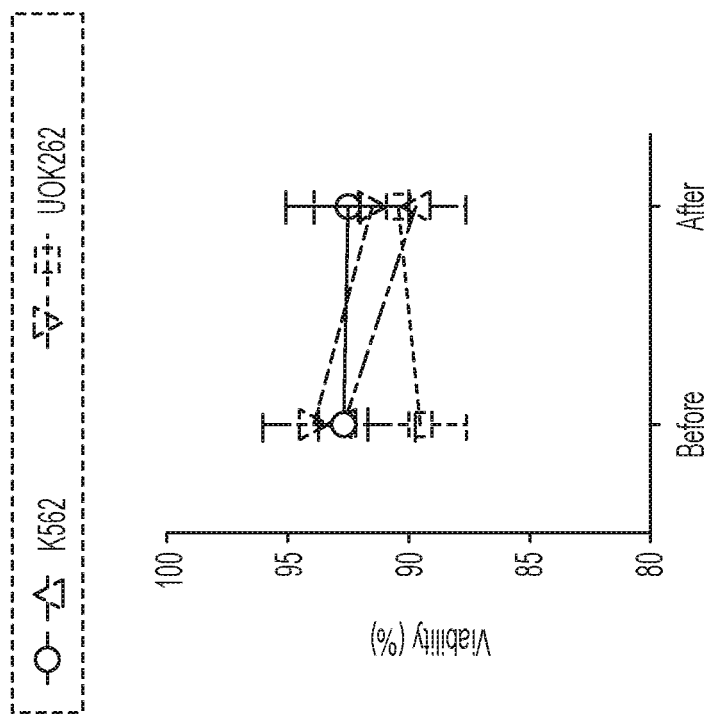
FIG. 11 shows a comparison of viability before and after HMRS assays. This is an extended plot of FIG. 3D right panel. Two cancer cell lines (K562 and UOK262) were tested. The "Before" measurement was conducted 15 minutes before the HMRS assay, and the "After" measurement was conducted 15 minutes after the HMRS assay. All measurements were performed in duplicate. Error bars show the standard deviation.

Five different cell lines, UOK262, U87, Jurkat, K562, and HK-2 (FIG. 3B), were profiled. UOK262 showed approximately 2-fold higher flux when compared to benign renal tubular cells, HK-2 (40.6 and 21.0 pmol/sec, respectively) (FIG. 3C). Cell viability was further assessed before and after the HMRS assay with two cancer cell lines, UOK262, as a representative of solid cancer, and K562, a chronic myeloid leukemia (CIVIL) cell line, as a representative of liquid cancer. The cell loss was negligible during the experiments, and cell viability was not significantly different (p-value=NS, FIG. 3D and FIG. 11), thereby demonstrating another advantage of the HMRS platform (e.g., non-destructive analysis of metabolic flux).

Quantification of Metabolic Flux in Leukemia Stem Cells

Figure 4A:
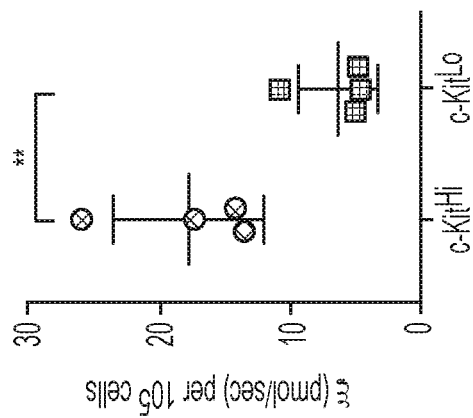
FIGS. 4A-4C show quantification of metabolic flux in leukemia stem cells.
Figure 4B:
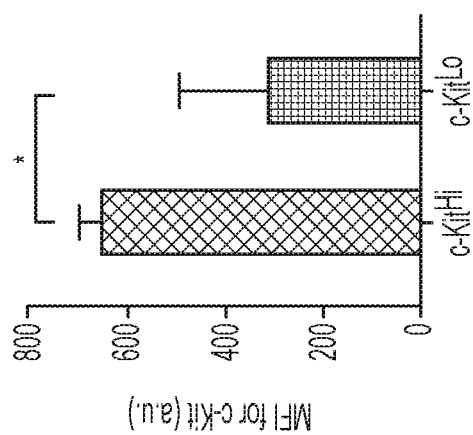
Figure 4C:
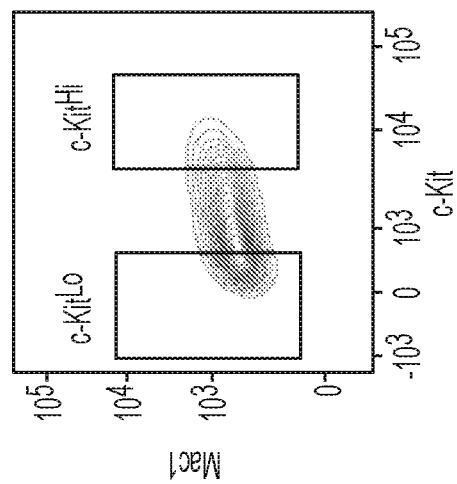
Figure 16B:
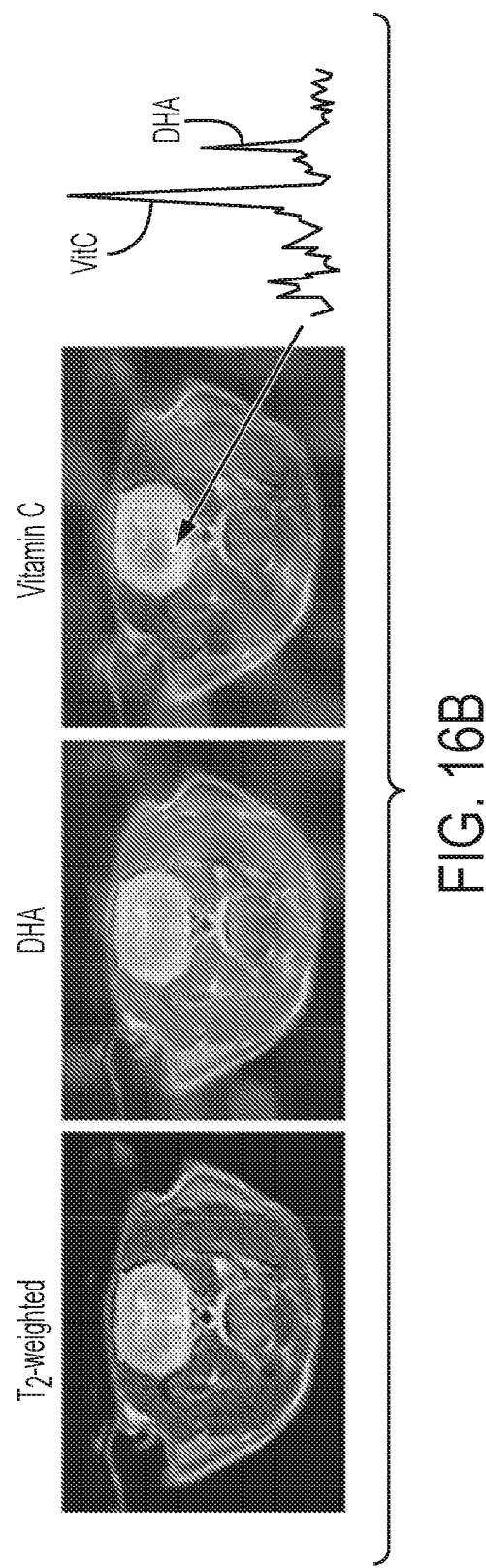
FIG. 16B shows real-time analysis of brain metabolism with hyperpolarized $^{13}$C-DHA and $^{13}$C-VitC (Vitamin C), according to an illustrative embodiment of the invention.
Figure 17:
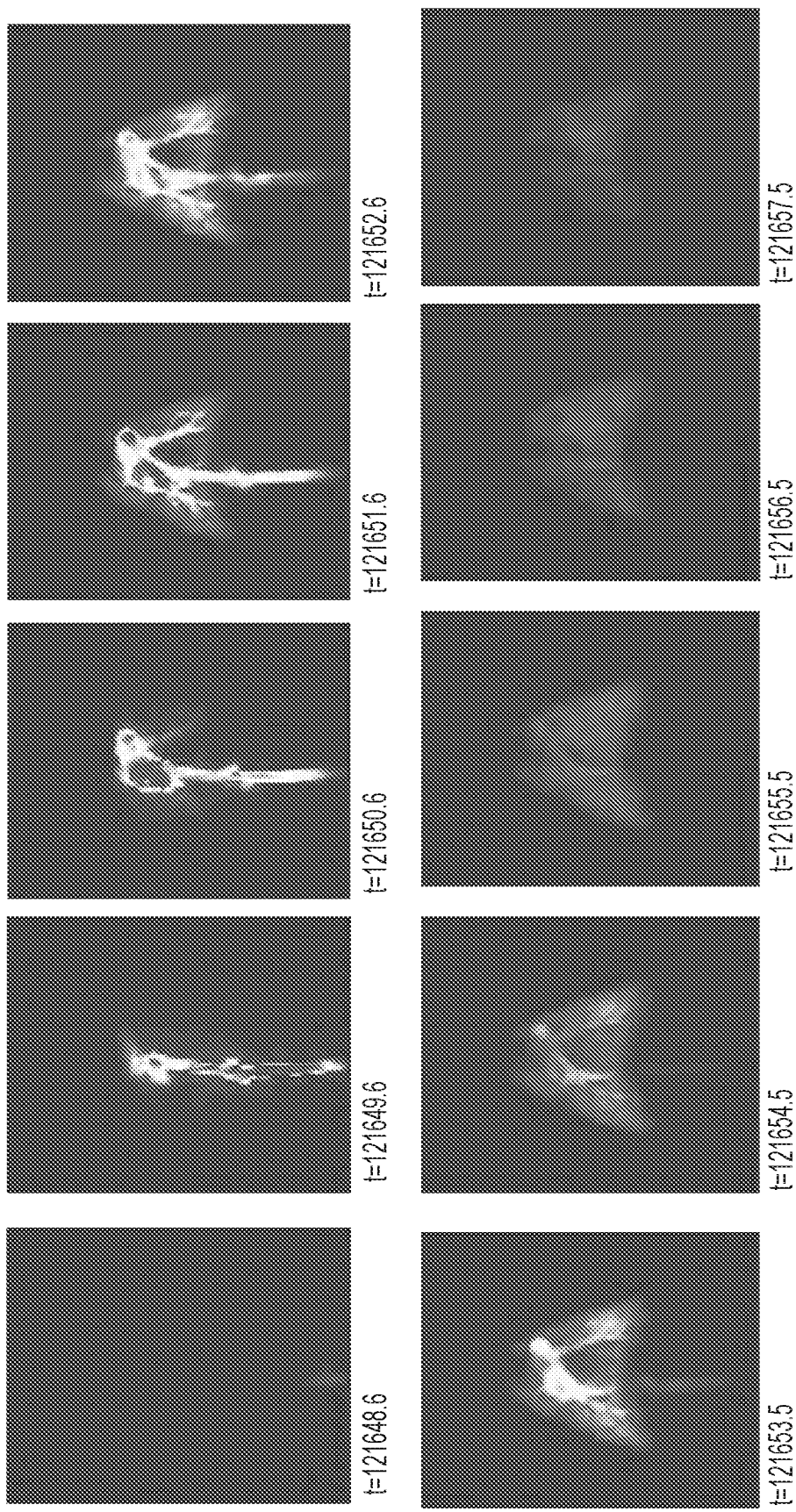
FIG. 17 shows real-time analysis of pulmonary perfusion with hyperpolarized 13-C-hydroxyethylpropionate, according to an illustrative embodiment of the invention.
Figure 18:
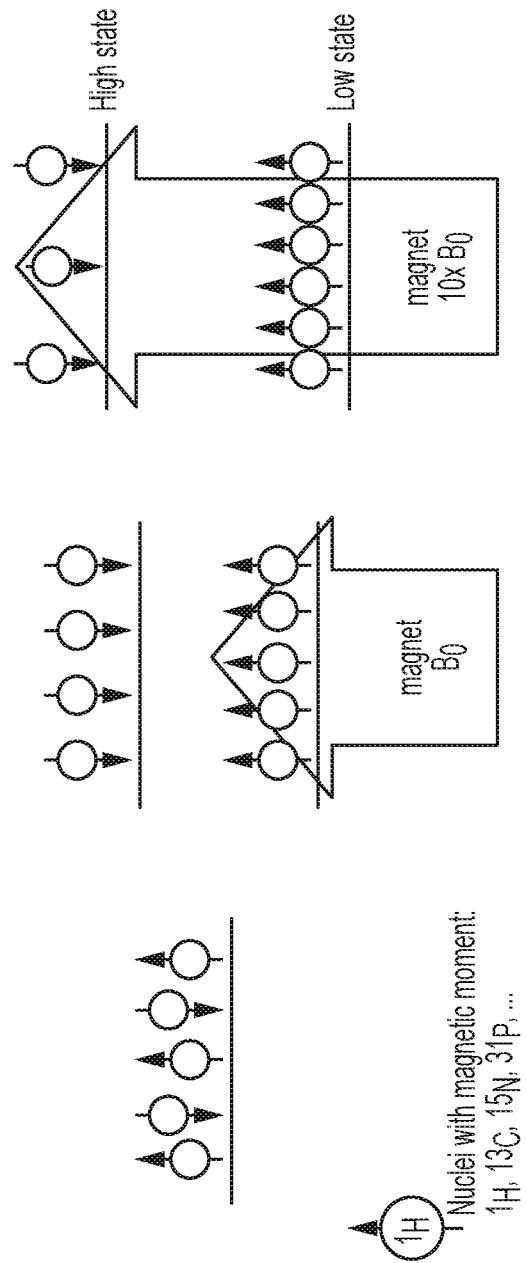
FIG. 18 shows a schematic of nuclei with magnetic moments that can be analyzed without any labeling. In certain embodiments, a NMR signal comes from the polarization (e.g., difference in state occupancy). Accordingly, the higher the magnetic field, the higher the polarization, and the higher the NMR signal. Note that a magnetic signal is not absorbed by biomaterial (e.g., tissue). A limitation of NMR is that nuclear polarization in a magnetic field is poor. For example, even in a high magnetic field (e.g., 10 Tesla), the polarization is only 0.0044%. Due to poor polarization, NMR is limited to the analysis of highly concentrated samples.
Figure 19:
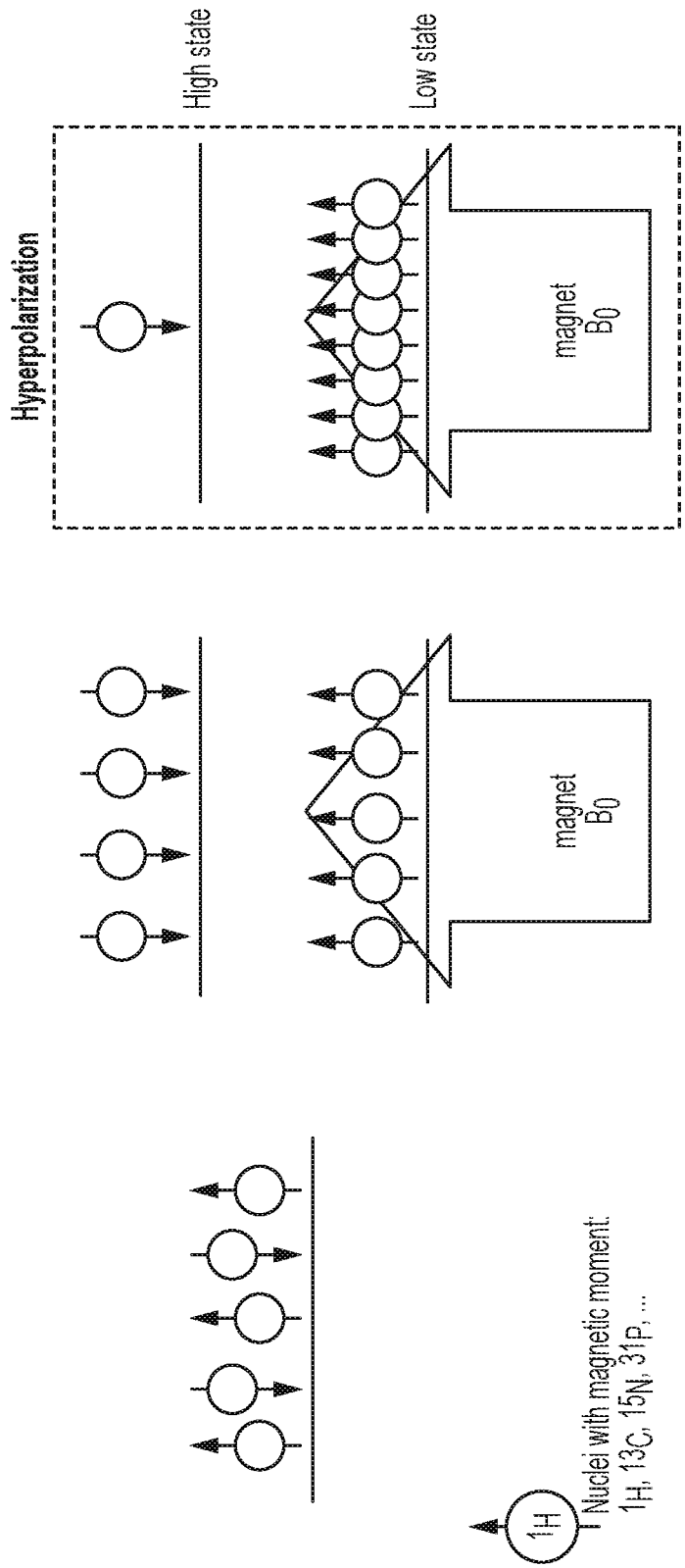
FIG. 19 shows a schematic that depicts how hyperpolarized NMR can be used to overcome limitations of NMR. For example, by using radicals with radiofrequency (RF) irradiation, the polarization of nuclei can be enhanced significantly (e.g., greater than 10,000-fold). Accordingly, hyperpolarized NMR can be applied to biological reactions in live cells.
Figure 20:
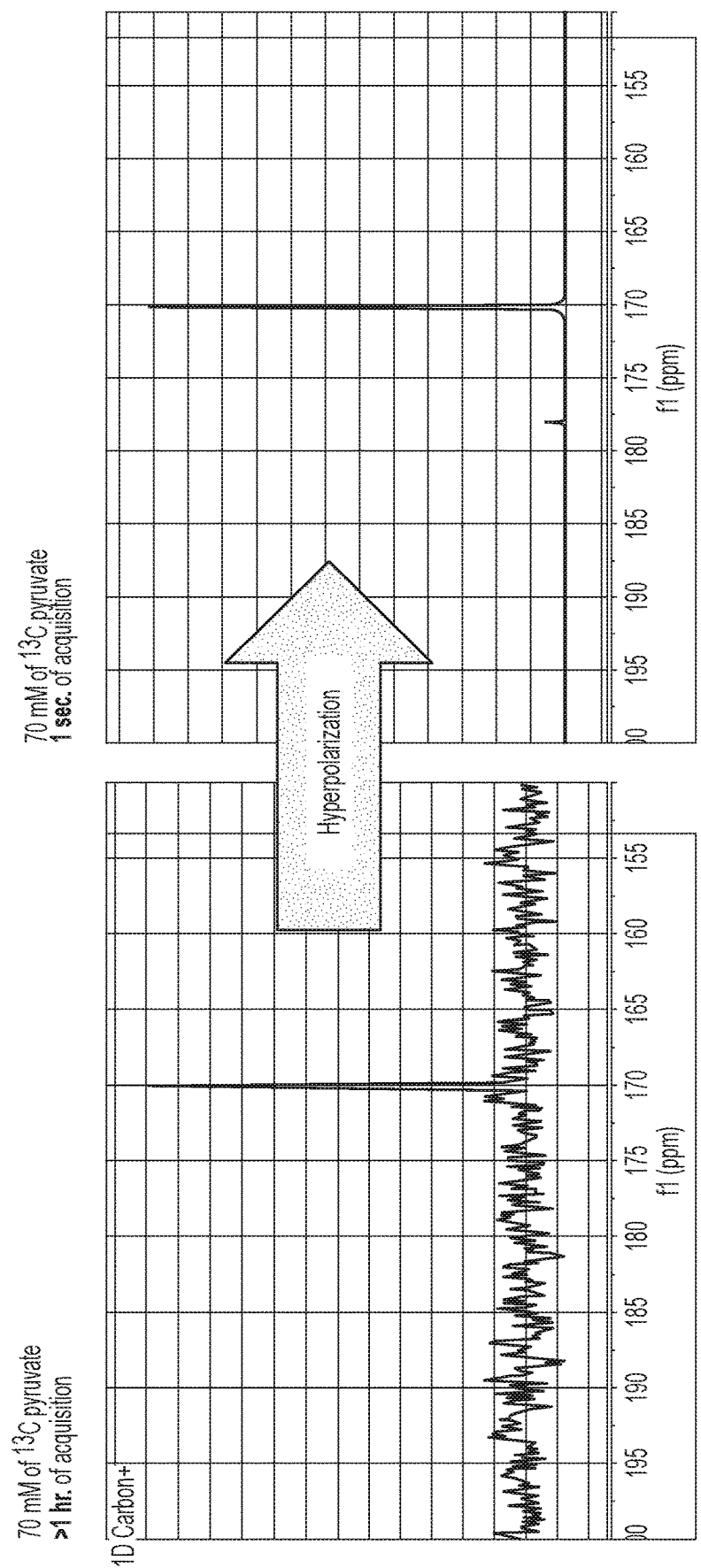
FIG. 20 shows data where hyperpolarized NMR is used to overcome limitations faced by NMR. The left panel of FIG. 20 shows that 70 mM of $^{13}$C pyruvate requires more than 1 hour of acquisition time in order to see an NMR peak. However, after hyperpolarization, the same only requires about 1 second of acquisition time.
Figure 21:
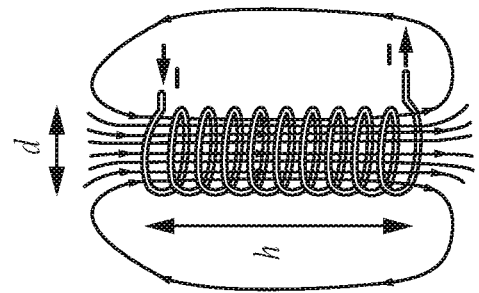
FIG. 21 shows that a smaller coil used in hyperpolarized micro-NMR systems provides higher sensitivity (e.g., higher signal-to-noise ratio). The present disclosure also describes alternative embodiments where sensitivity is increased.
Figure 22:
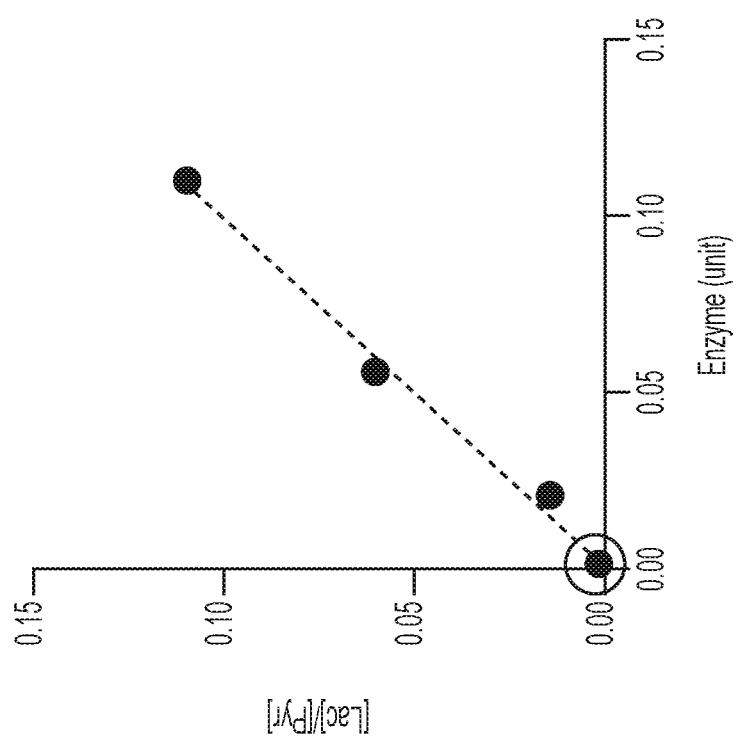
FIG. 22 shows monitoring and sensitive analysis of enzymatic reactions (30 pmol/sec).
Figure 23B:
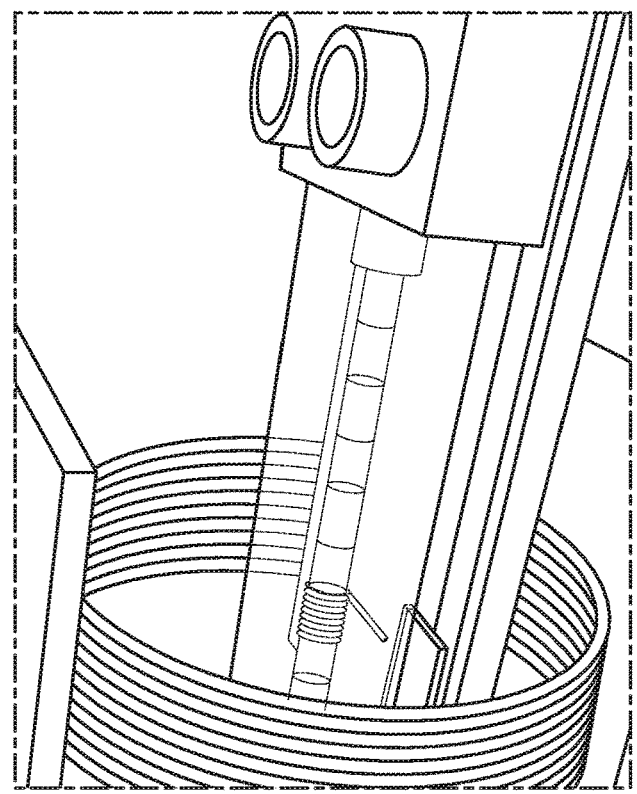
FIGS. 23A-23B show a 3D-printed multi-well microreservoir that supplies different samples for NMR analyses, according to an illustrative embodiment of the invention.
Figure 23A:
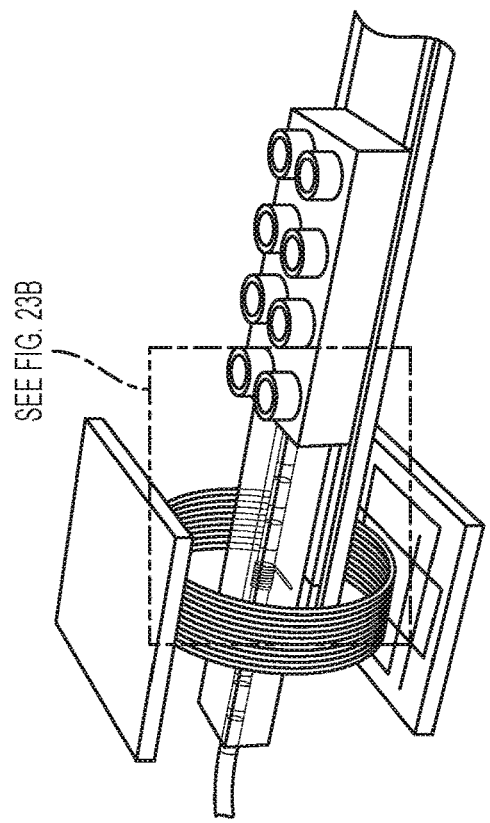

Leukemia stem cells (LSCs, or leukemia-initiating cells), defined by their ability to initiate and re-establish malignancy upon transplantation, are more resistant to conventional therapeutic regimens as compared to bulk leukemia populations. Considering that distinct metabolic features confer the survival benefits to cancer cells, understanding LSC's reliance on specific metabolic pathways has the potential to illuminate more effective therapeutic strategies to target cancer stem cells. With this in mind, increased sensitivity of the HMRS platform was taken advantage of to quantify metabolic flux in primary LSCs, previously not possible using conventional approaches. LSCs in acute myeloid leukemia (AML) driven by MLL-AF9 oncogene are of particular interest as MLL-AF9 is related to deregulated expression of Myc33,34, which potentially mediates metabolic reprogramming in cancer. LSCs, collected from the bone marrow in MLL-AF9 AML mice, were sorted based on the surface protein, c-Kit (CD117), and assayed rapidly within 24 hours non-invasively (FIGS. 4A and 4B). Interestingly, LSCs (c-Kit$^{Hi}$) demonstrated nearly 2-fold higher flux than leukemia non-stem cells (c-Kit$^{Lo}$) (FIG. 4C). Given that the provided approach is non-destructive, it was possible to further assay the status of c-Myc in these primary cells by immunoblot (FIG. 16), which confirmed that c-Kit$^{Hi}$ cells also exhibited high expression levels of Myc. While further experiments can be performed to characterize the control of metabolism by c-Myc in primary c-Kit$^{Hi}$ LSCs, the experiments using hyperpolarized substrates provides quantitative evidence of differential metabolism in the LSC compartment.

Rapid Quantitative Assessment of Drug Treatment Response

Since metabolic changes can be induced by anticancer drug treatments before major clinicopathological changes occur, any metabolic changes related to the pathway can be an early indicator of the treatment efficacy. Accordingly, the HMRS platform was applied for rapid assessment of drug-treatment efficacy, based on the advantages of high sensitivity and non-destructiveness for metabolic flux analysis.

Figure 12:
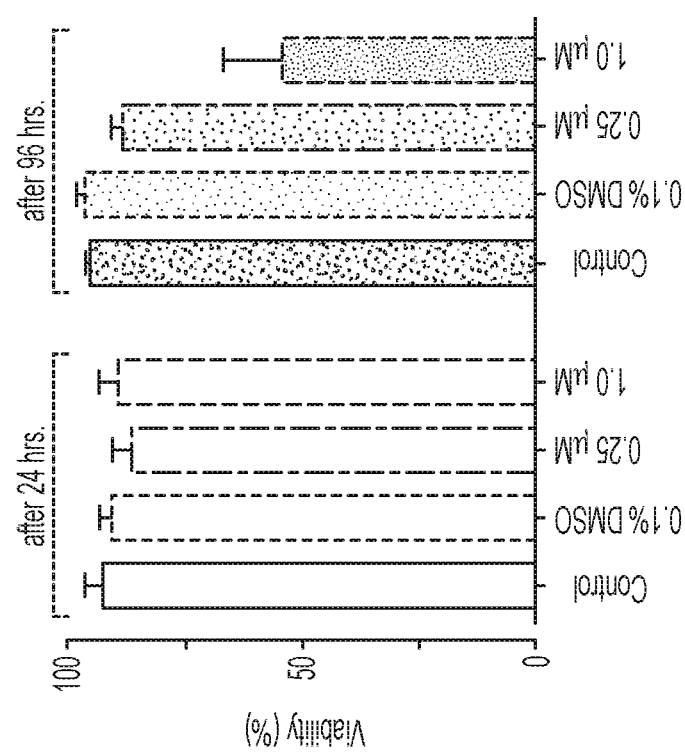
FIG. 12 shows viability after imatinib treatment on K562 cells. The viability of K562 cells was compared after 24 hours and 96 hours of treatment. All measurements were performed in triplicate. Error bars show the standard deviation.
Figure 13:
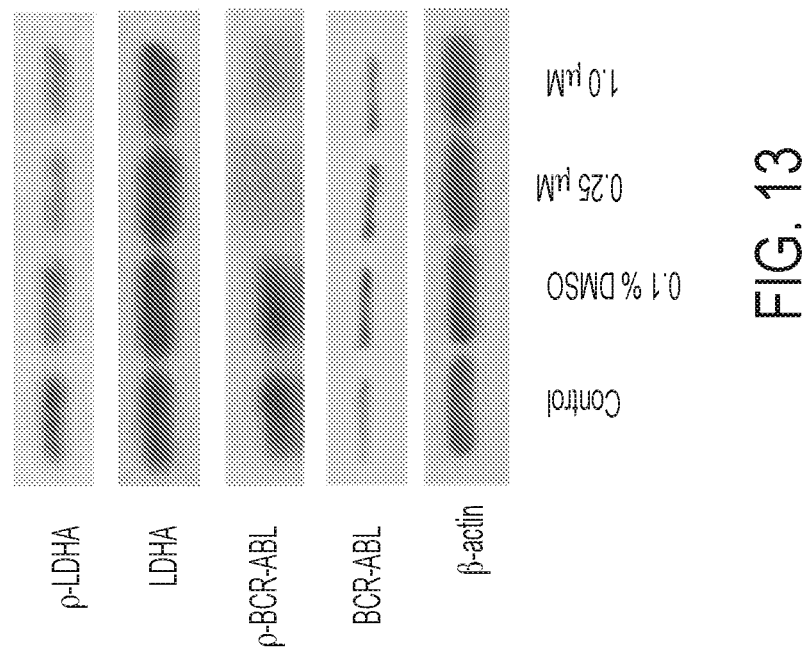
FIG. 13 shows changes in protein expression and phosphorylation levels after treatment. After 24 hours of imatinib treatment to K562 cells, the oncogenic tyrosine kinase, BCR-ABL, and the metabolic enzyme, LDHA, were analyzed by western blotting.

Imatinib (GLEEVEC), a BCR-ABL tyrosine kinase inhibitor developed for chronic myeloid leukemia (CML) treatment, has been shown to affect glycolytic activity in cancer cells. It was reasoned that glycolytic flux analysis on K562 cells with imatinib treatment would be a model to assess time dependent changes in drug action. After 24 hours of drug treatment, the rate of cell proliferation was slightly decreased, and the cell viability was not significantly changed at concentrations as high as 1 μM imatinib (FIGS. 5A, 5B, and FIG. 12). However, using the HMRS, it was found that the lactate peak decreased by approximately 75% after 24 hours of 1 μM imatinib treatment (FIGS. 5C and 5D). This reduction in the glycolytic flux could be explained by the signaling pathways targeted by the treatment: the phosphorylation level of the target protein, BCR-ABL, decreased even at 0.25 μM imatinib treatment, which led to down-regulation of the PI3K/AKT/mTOR pathway and decreased phosphorylation of a key metabolic enzyme, LDH-A (FIG. 13). By assessing different time points, it was found that the drug effect could be detected as early as 3 hours post-treatment (FIGS. 5E and 5F). Contrary to the flux analysis, the analysis of metabolite concentrations using a conventional high-field NMR spectrometer showed much slower response to treatment (FIG. 5G). Without wishing to be bound to any theory, this significant difference between the analyses of flux and pool sizes can be explained as following: the flux indicates the metabolic activity at a given moment, but the pool size indicates the integration of the metabolic activity over a certain period. Imatinib starts to affect metabolic activities in K562 cells as early as 3 hours post-treatment, and the decreased glycolytic activity begins to change the lactate pool size, which is large (on the order of mM). In the provided assay, it required about 12 hours to make a significant change in the pool size. These results demonstrate another advantage of the HMRS flux analysis: rapid assessment of treatment efficacy.

Multiple Analyses in a Single Dissolution

While current approaches provide a means of rapidly measuring metabolic fluxes, there remains a need for developing high-throughput approaches. In order to address this need, the HMRS platform was advanced to enable high-throughput analysis of hyperpolarized molecules. The DNP method provides greater than 20% polarization for $^{13}$C nuclei, but it has some limitations in throughput. For example, (i) the DNP method takes more than an hour for hyperpolarization with relatively expensive chemical compounds, and ii) the hyperpolarized state decays to thermal equilibrium rapidly with RF excitation pulses, which allows for only one NMR experiment. There is a great need for approaches that enable a high-throughput analysis with the DNP-NMR method. It was hypothesized that multiple NMR analyses could be performed if intact hyperpolarized molecules could be supplied constantly into the micro-coil in a time frame proportional to the $T_1$ relaxation time of the hyperpolarized molecule.

Figure 14:
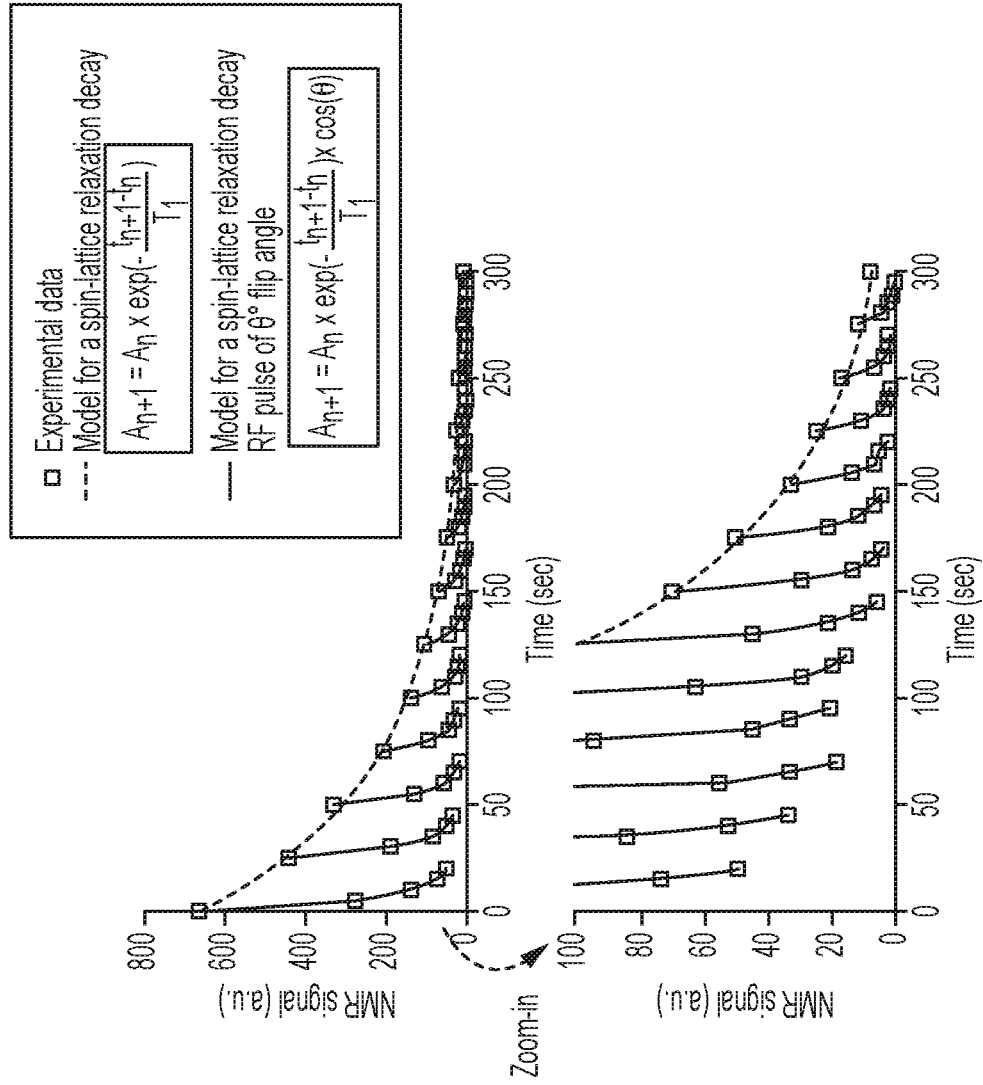
FIG. 14 shows a high-throughput analysis of hyperpolarized pyruvate. NMR signal of hyperpolarized pyruvate was acquired by the HMRS system integrated with the microreservoir. Twelve analyses were performed from a single dissolution of hyperpolarized pyruvate; each analysis comprises five NMR signals. After one analysis was finished (e.g., five NMR signals were acquired), intact hyperpolarized pyruvate was loaded into the micro-coil for further analysis.
Figure 15:
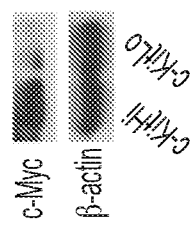
FIG. 15 shows an immunoblot analysis for c-Myc in leukemia stem cells (c-Kit$^{Hi}$) and leukemia non-stem cells (c-Kit$^{Lo}$).

A 3D-printed micro-reservoir was designed to hold samples for multiple experiments (e.g., up to 100 μL) and was connected to the inlet of the micro-coil channel (FIG. 6A). The channel outlet was connected to a syringe pump (PH2000, Harvard Apparatus) with a pulling rate of 5 μL/sec. FIG. 6B describes the assay scheme of high-throughput analysis from a single dissolution; i) the syringe pump pulled the sample (Z1) to the micro-coil region, followed by $^{13}$C NMR signal acquisition, ii) after the acquisition, the syringe pump pulled the intact sample (Z2) into the micro-coil region, and iii) another 13C NMR signal acquisition started. Integrated with the micro-reservoir, the HMRS platform successfully conducted 12 analyses of the hyperpolarized spin states from a single dissolution (FIGS. 6C, 6D, and FIG. 14). All 12 analyses were fit to a single decay model with $T_1$ of 67 seconds and RF pulse of 60° flip angle, which yielded 99.5±0.4% of $R_2$ and 3.07±1.05% of root-mean-square error between analyses (FIG. 6D). Moreover, this approach was extended to the multiple analyses of glycolytic flux in cancer cells from a single dissolution (FIG. 6E). The provided integrated HMRS platform, separating the sample reservoir from the micro-coil (where RF pulses were applied), achieved multiple analyses from a single dissolution of hyperpolarized molecules. This analytical capability shows the potential of the HMRS for high-throughput flux analysis in cells.

Methods and Materials

Microcoil Fabrication

Thin magnet wire (Belden 8042, 32 AWG) was wound five times around a metal rod (diameter of 1.4 mm), and it was embedded into polydimethylsiloxane (PDMS) (Down Corning). After PDMS curing for overnight at 80° C., the wire was pulled out, which formed a miniaturized solenoid coil (micro-coil) with a microfluidic channel.

3D-Printed Micro-Reservoir

A CAD software (3Ds MAX, Autodesk) and a 3D-printer (Micro Plus Hi-Res, EnvisionTec) was used to design and print a micro-reservoir. The outlet (1.4-mm diameter) of the micro-reservoir was designed to fit into the microfluidic channel and the inlet of the micro-reservoir (10-mm diameter) was designed for easy-loading of sample. The maximum capacity of the micro-reservoir was about 100 μL.

Drug (Imatinib) Treatment on K562 Cells

K562 cells were plated with a concentration of 100,000 cells/mL in 10 mL complete RPMI media. 10 μL of complete RPMI media, dimethyl sulfoxide (DMSO), 0.25 mM imatinib in DMSO, and 1 mM imatinib in DMSO were loaded for control sample, 0.1% DMSO-treated sample, 0.25 μM and 1.0 μM imatinib-treated samples, respectively. Imatinib was purchased from Cayman Chemical. Two sets of four flasks (two flasks per each sample) were prepared and stored in an incubator for 24 hours. Cell number and viability were checked after 24 hours, and cells were washed with complete RPMI media once and prepared for hyperpolarization experiments.

Hyperpolarization Using Dynamic Nuclear Polarization (DNP)

A SPINLab polarizer (GE) was used to polarize [1-$^{13}$C] pyruvate. The preparation steps for polarization are the following: i) $^{13}$C-enriched pyruvate sample was prepared with radical: 15 mM of AH-111501 (GE) was mixed in [1-$^{13}$C] pyruvic acid (Sigma Aldrich: 677175) thoroughly. ii) Buffer solution for dissolution was prepared: 0.4 mM of ethylenediaminetetraacetic acid (EDTA) was added in 40 mM of Trizma® hydrochloride solution (Sigma Aldrich: T2663). iii) 100 μL of the pyruvate sample from step i) and 20 mL of the buffer solution from step ii) were loaded into the SPINLab polarizer (3 Tesla, 0.98K). After 90 minutes of polarization, the pyruvate sample was quickly dissolved into an ice-cold flask with 120 μL of 10N sodium hydroxide solution (Fisher Scientific: SS255) to make the dissolved sample neutral (pH~7.4) and reach 37° C. faster. The dissolved pyruvate sample was added into cell suspension with a ratio of 1:10.

Cell Culture

K562 and Jurkat cells were grown in Gibco® RPMI-160 medium (Thermo Fisher Scientific: 11875-093). UOK262 and HK-2 cells were grown in Advanced DMEM/F-12 (Thermo Fisher Scientific: 12634-010). U87 cells were grown in EMEM (ATCC: 30-2003). All media were supplemented with 10% fetal bovine serum (FBS) and penicillin-streptomycin.

Cell Number and Viability

The cell number and the viability were measured using CELLOMETER Mini cell counter (Nexcelom Bioscience); the cell suspension was mixed at 1:1 ratio with the trypan blue solution before the measurement. For each measurement, the cell suspension was diluted to make its concentration within a range of 0.8-2×10$^6$/mL.

FACS Sorting of Leukemia Cells

Bone marrow from leukemia mice transplanted with MLL-AF9 leukemia cells were processed and stained with Mac1-PacBlue and c-Kit-PeCy7 (34). The top 15% and lowest 20% of c-Kit cells were sorted as c-Kit$^{Hi}$ and c-Kit$^{Lo}$ cells, respectively, using BD FACS Aria III instrument. Cells were cultured in RPMI media containing SCF (long/ml), IL-3 (long/ml) and IL-6 (long/ml) for 20 hours before hyperpolarization experiments.

Western Blot Analysis

K562 cells, washed with cold PBS w/o Ca+Mg and concentrated by centrifugation (3000 rpm, 10 min), were lysed in RIPA buffer (Thermo Scientific: 89901) containing protease and phosphatase inhibitors (Thermo Scientific: 78480, 78420). The concentration of protein lysates was quantified using a BCA assay. Protein lysates were resolved using NuPAGE pre-cast gels and transferred to NOVEX polyvinylidene difluoride (PVDF) membrane (Thermo Fisher Scientific: LC2002), as described in the manufacturer's protocol. Target proteins in the membrane were immunoblotted with primary antibodies; BCR-ABL (Cell Signaling: 3902), phospho BCR-ABL (Cell Signaling: 3901), LDHA (Cell Signaling: 2012), phospho LDHA (Cell Signaling: 8176), and β-actin (Cell Signaling: 8457). The horseradish peroxidase (HRP) conjugated secondary antibodies (Santa Cruz Biotechnology: SC-2004) were then incubated with the membrane. Protein bands were detected on X-ray film (Thermo Fisher Scientific: 34090) using the chemiluminescent (ECL) HRP substrate (Thermo Fisher Scientific: 34080).

Smaller Coil is More Sensitive for Mass-Limited Samples

FIG. 10 shows that smaller coils are more sensitive for mass-limited samples. It was found that NMR signal depends on the diameter of a micro-coil. FIG. 10 depicts a plot that tests micro-coils having diameters of 1.4 mm to measure a concentration of 17.5 μmole in a sample, 2.8 mm to measure a concentration of 17.5 μmole in a sample, and 2.8 mm a concentration of 70 μmole in a sample that yielded a NMR signal (a.u.) of about 40, 20, and 80 respectively. Accordingly. FIG. 10 shows that the same amount of target material can be detected at higher sensitivity when using a smaller coil (e.g., having a diameter of 1.4 mm) compared to a larger coil (e.g., having a diameter of 2.8 mm). However, using a coil that has too small of a diameter can present issues with sample loading. Accordingly, the systems provided herein are well-fitted to measure metabolic flux in limited about of cells in a sample (e.g., cancer stem cells, e.g., stem cells, e.g., a patient biopsy sample).

High-Throughput Micro-NMR Devices

To develop a micro-NMR system that would conduct multiple hyperpolarized NMR experiments, the provided systems and methods were designed to continuously supply hyperpolarized molecules into the NMR coil.

A 3D-printed micro-reservoir was designed to supply samples for high-throughput experiments (FIGS. 6A-6E). An exemplary assay scheme of high-throughput analysis from a single dissolution of hyperpolarized molecules is depicted in FIGS. 6A-6E.

FIG. 6B shows that microfluidic system pulls the sample "Z1" into the micro-coil region, followed by $^{13}$C NMR signal acquisition. After the acquisition, the microfluidic system pulls another intact sample ("Z2") into the micro-coil region, and another $^{13}$C NMR signal acquisition is started. This process is continuously repeated.

FIGS. 6D and 6E show that more than 12 analyses of hyperpolarized molecules are achievable with 99.5% of R2 between analyses (FIG. 6D). Moreover, multiple analyses of metabolic activities in live cells can be done with a single dissolution (FIG. 6E).

FIG. 6F shows a 3D-printed multi-well micro-reservoir that supplies different samples for NMR analyses, according to an illustrative embodiment of the invention. Different samples in each well are loaded into the micro-coil region, where $^{13}$C NMR signal is acquired. Each acquisition is finished within 1 second, and the sample switching time is less than 5 seconds. Accordingly, an analysis of 8 samples can be finished within 1 minute.

Illustrative Network Environment

Figure 24:
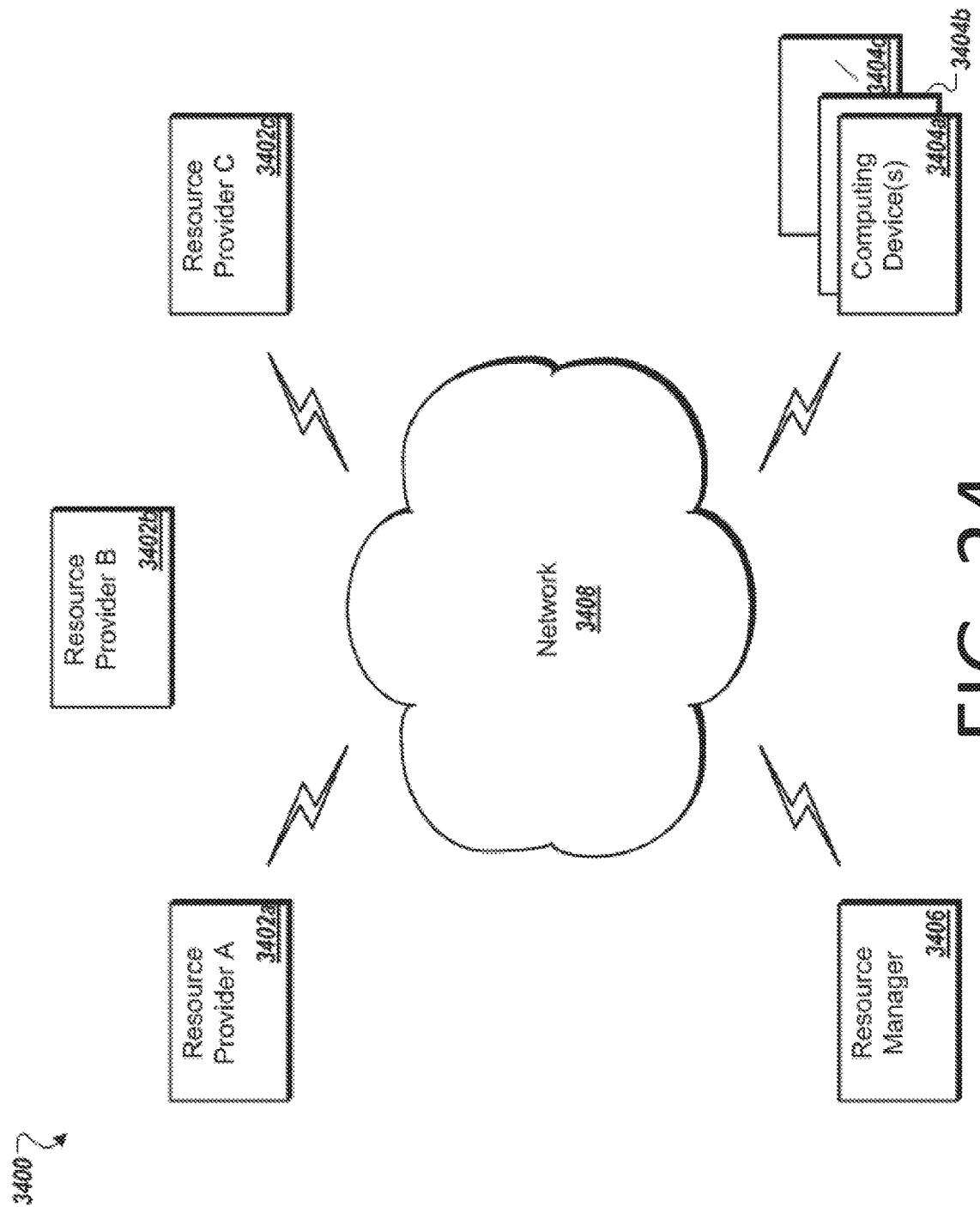
FIG. 24 is a block diagram of an example network environment for use in the methods and systems for analysis of spectrometry data, according to an illustrative embodiment.

FIG. 24 shows an illustrative network environment 2400 for use in the methods and systems for analysis of spectrometry data corresponding to particles of a sample, as described herein. In brief overview, referring now to FIG. 24, a block diagram of an exemplary cloud computing environment 2400 is shown and described. The cloud computing environment 2400 may include one or more resource providers 2402a, 2402b, 2402c (collectively, 2402). Each resource provider 2402 may include computing resources. In some implementations, computing resources may include any hardware and/or software used to process data. For example, computing resources may include hardware and/or software capable of executing algorithms, computer programs, and/or computer applications. In some implementations, exemplary computing resources may include application servers and/or databases with storage and retrieval capabilities. Each resource provider 2402 may be connected to any other resource provider 2402 in the cloud computing environment 2400. In some implementations, the resource providers 2402 may be connected over a computer network 2408. Each resource provider 2402 may be connected to one or more computing device 2404a, 2404b, 2404c (collectively, 2404), over the computer network 2408.

The cloud computing environment 2400 may include a resource manager 2406. The resource manager 2406 may be connected to the resource providers 2402 and the computing devices 2404 over the computer network 2408. In some implementations, the resource manager 2406 may facilitate the provision of computing resources by one or more resource providers 2402 to one or more computing devices 2404. The resource manager 2406 may receive a request for a computing resource from a particular computing device 2404. The resource manager 2406 may identify one or more resource providers 2402 capable of providing the computing resource requested by the computing device 2404. The resource manager 2406 may select a resource provider 2402 to provide the computing resource. The resource manager 2406 may facilitate a connection between the resource provider 2402 and a particular computing device 2404. In some implementations, the resource manager 2406 may establish a connection between a particular resource provider 2402 and a particular computing device 2404. In some implementations, the resource manager 2406 may redirect a particular computing device 2404 to a particular resource provider 2402 with the requested computing resource.

Figure 25:
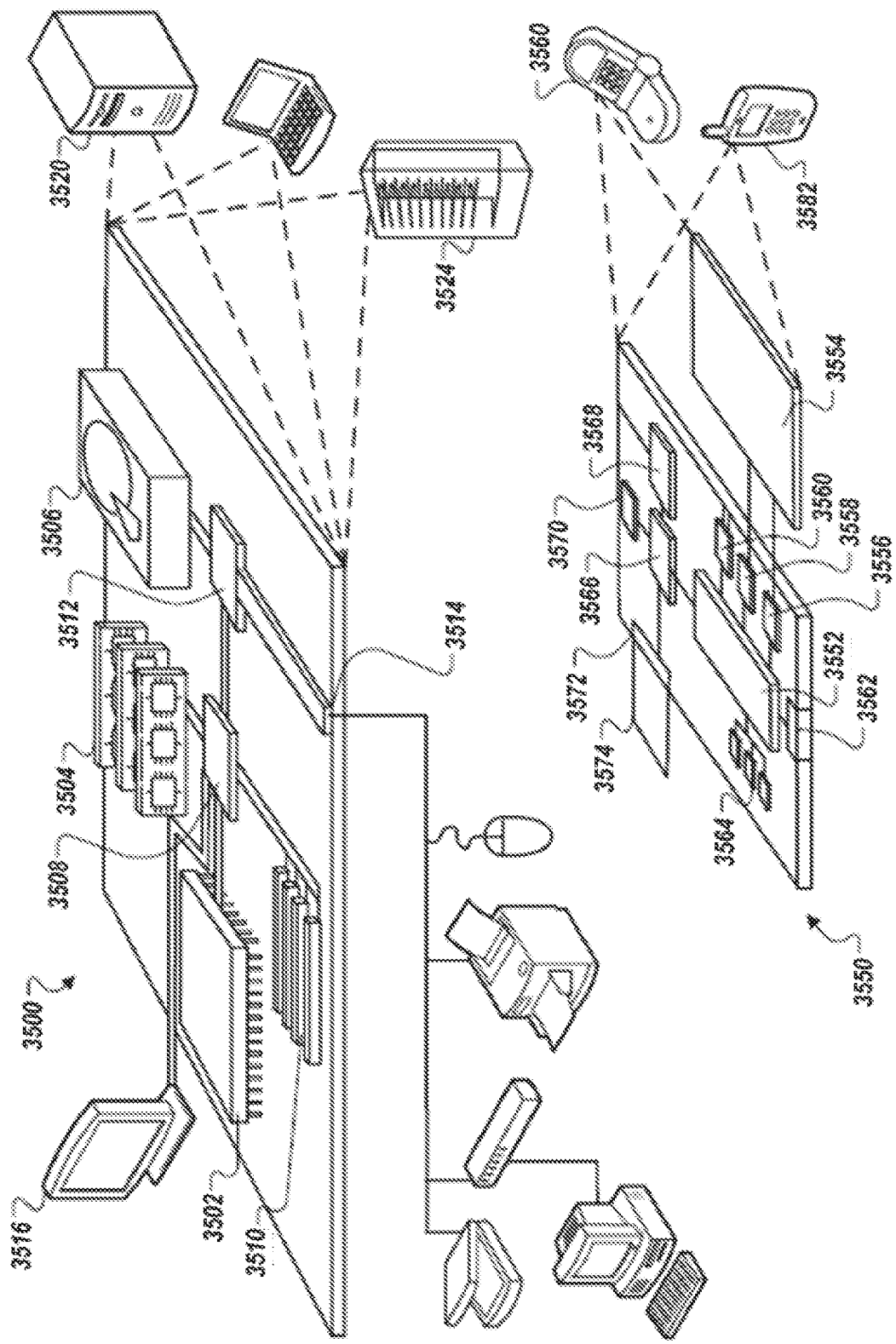
FIG. 25 is a block diagram of an example computing device and an example mobile computing device, for use in illustrative embodiments of the invention.
Figure 26:
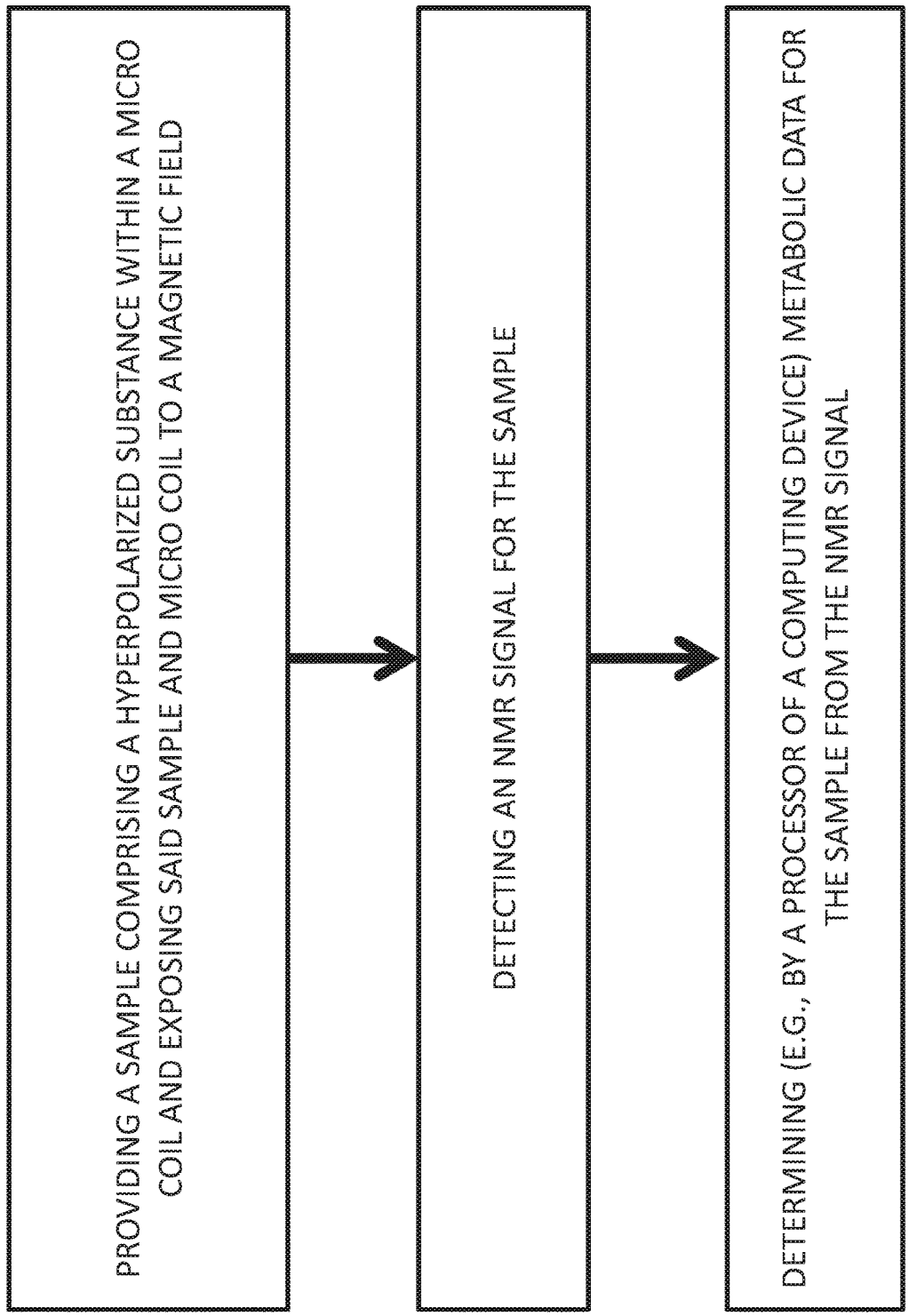
FIGS. 26-28 show a method of sample analysis, according to an illustrative embodiment of the invention.
Figure 27:
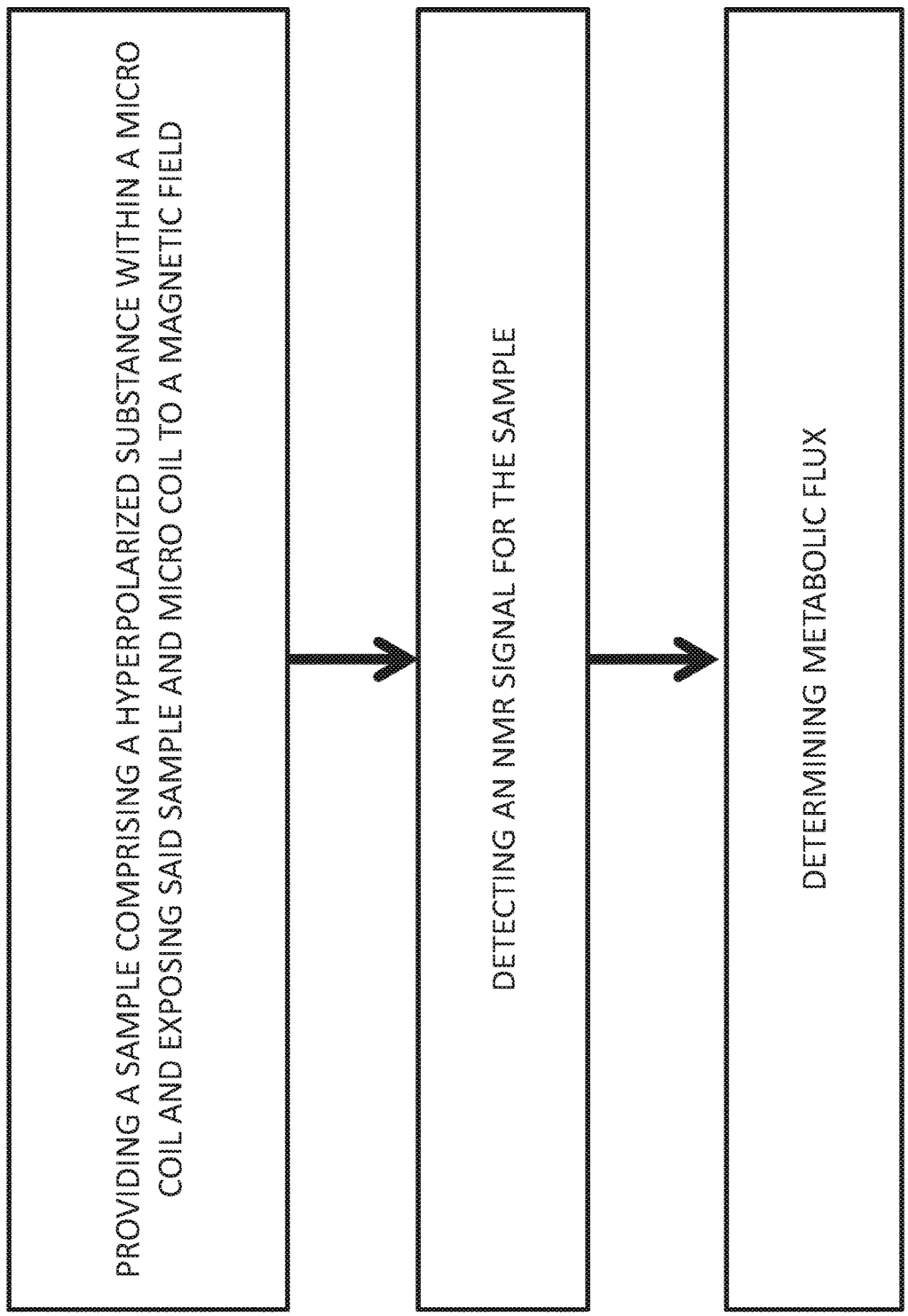
Figure 28:
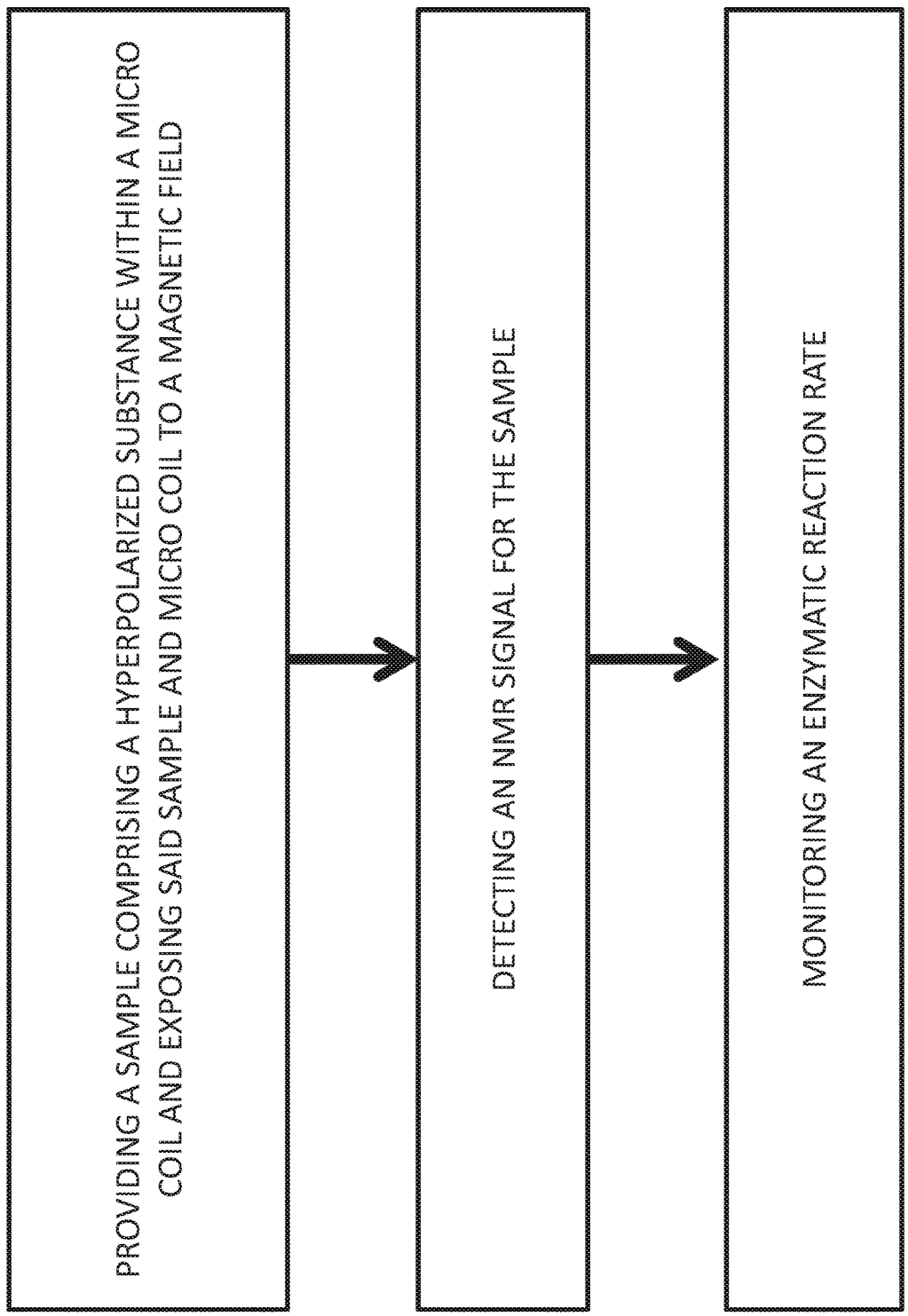

FIG. 25 shows an example of a computing device 2500 and a mobile computing device 2550 that can be used in the methods and systems described in this disclosure. The computing device 2500 is intended to represent various forms of digital computers, such as laptops, desktops, workstations, personal digital assistants, servers, blade servers, mainframes, and other appropriate computers. The mobile computing device 2550 is intended to represent various forms of mobile devices, such as personal digital assistants, cellular telephones, smart-phones, and other similar computing devices. The components shown here, their connections and relationships, and their functions, are meant to be examples only, and are not meant to be limiting.

The computing device 2500 includes a processor 2502, a memory 2504, a storage device 2506, a high-speed interface 2508 connecting to the memory 2504 and multiple high-speed expansion ports 2510, and a low-speed interface 2512 connecting to a low-speed expansion port 2514 and the storage device 2506. Each of the processor 2502, the memory 2504, the storage device 2506, the high-speed interface 2508, the high-speed expansion ports 2510, and the low-speed interface 2512, are interconnected using various busses, and may be mounted on a common motherboard or in other manners as appropriate. The processor 2502 can process instructions for execution within the computing device 2500, including instructions stored in the memory 2504 or on the storage device 2506 to display graphical information for a GUI on an external input/output device, such as a display 2516 coupled to the high-speed interface 2508. In other implementations, multiple processors and/or multiple buses may be used, as appropriate, along with multiple memories and types of memory. Also, multiple computing devices may be connected, with each device providing portions of the necessary operations (e.g., as a server bank, a group of blade servers, or a multi-processor system).

The memory 2504 stores information within the computing device 2500. In some implementations, the memory 2504 is a volatile memory unit or units. In some implementations, the memory 2504 is a non-volatile memory unit or units. The memory 2504 may also be another form of computer-readable medium, such as a magnetic or optical disk.

The storage device 2506 is capable of providing mass storage for the computing device 2500. In some implementations, the storage device 2506 may be or contain a computer-readable medium, such as a floppy disk device, a hard disk device, an optical disk device, or a tape device, a flash memory or other similar solid state memory device, or an array of devices, including devices in a storage area network or other configurations. Instructions can be stored in an information carrier. The instructions, when executed by one or more processing devices (for example, processor 2502), perform one or more methods, such as those described above. The instructions can also be stored by one or more storage devices such as computer- or machine-readable mediums (for example, the memory 2504, the storage device 2506, or memory on the processor 2502).

The high-speed interface 2508 manages bandwidth-intensive operations for the computing device 2500, while the low-speed interface 2512 manages lower bandwidth-intensive operations. Such allocation of functions is an example only. In some implementations, the high-speed interface 2508 is coupled to the memory 2504, the display 2516 (e.g., through a graphics processor or accelerator), and to the high-speed expansion ports 2510, which may accept various expansion cards (not shown). In the implementation, the low-speed interface 2512 is coupled to the storage device 2506 and the low-speed expansion port 2514. The low-speed expansion port 2514, which may include various communication ports (e.g., USB, Bluetooth®, Ethernet, wireless Ethernet) may be coupled to one or more input/output devices, such as a keyboard, a pointing device, a scanner, or a networking device such as a switch or router, e.g., through a network adapter.

The computing device 2500 may be implemented in a number of different forms, as shown in the figure. For example, it may be implemented as a standard server 2520, or multiple times in a group of such servers. In addition, it may be implemented in a personal computer such as a laptop computer 2522. It may also be implemented as part of a rack server system 2524. Alternatively, components from the computing device 2500 may be combined with other components in a mobile device (not shown), such as a mobile computing device 2550. Each of such devices may contain one or more of the computing device 2500 and the mobile computing device 2550, and an entire system may be made up of multiple computing devices communicating with each other.

The mobile computing device 2550 includes a processor 2552, a memory 2564, an input/output device such as a display 2554, a communication interface 2566, and a transceiver 2568, among other components. The mobile computing device 2550 may also be provided with a storage device, such as a micro-drive or other device, to provide additional storage. Each of the processor 2552, the memory 2564, the display 2554, the communication interface 2566, and the transceiver 2568, are interconnected using various buses, and several of the components may be mounted on a common motherboard or in other manners as appropriate.

The processor 2552 can execute instructions within the mobile computing device 2550, including instructions stored in the memory 2564. The processor 2552 may be implemented as a chipset of chips that include separate and multiple analog and digital processors. The processor 2552 may provide, for example, for coordination of the other components of the mobile computing device 2550, such as control of user interfaces, applications run by the mobile computing device 2550, and wireless communication by the mobile computing device 2550.

The processor 2552 may communicate with a user through a control interface 2558 and a display interface 2556 coupled to the display 2554. The display 2554 may be, for example, a TFT (Thin-Film-Transistor Liquid Crystal Display) display or an OLED (Organic Light Emitting Diode) display, or other appropriate display technology. The display interface 2556 may comprise appropriate circuitry for driving the display 2554 to present graphical and other information to a user. The control interface 2558 may receive commands from a user and convert them for submission to the processor 2552. In addition, an external interface 2562 may provide communication with the processor 2552, so as to enable near area communication of the mobile computing device 2550 with other devices. The external interface 2562 may provide, for example, for wired communication in some implementations, or for wireless communication in other implementations, and multiple interfaces may also be used.

The memory 2564 stores information within the mobile computing device 2550. The memory 2564 can be implemented as one or more of a computer-readable medium or media, a volatile memory unit or units, or a non-volatile memory unit or units. An expansion memory 2574 may also be provided and connected to the mobile computing device 2550 through an expansion interface 2572, which may include, for example, a SIMM (Single In Line Memory Module) card interface. The expansion memory 2574 may provide extra storage space for the mobile computing device 2550, or may also store applications or other information for the mobile computing device 2550. Specifically, the expansion memory 2574 may include instructions to carry out or supplement the processes described above, and may include secure information also. Thus, for example, the expansion memory 2574 may be provided as a security module for the mobile computing device 2550, and may be programmed with instructions that permit secure use of the mobile computing device 2550. In addition, secure applications may be provided via the SIMM cards, along with additional information, such as placing identifying information on the SIMM card in a non-hackable manner.

The memory may include, for example, flash memory and/or NVRAM memory (non-volatile random access memory), as discussed below. In some implementations, instructions are stored in an information carrier and, when executed by one or more processing devices (for example, processor 2552), perform one or more methods, such as those described above. The instructions can also be stored by one or more storage devices, such as one or more computer- or machine-readable mediums (for example, the memory 2564, the expansion memory 2574, or memory on the processor 2552). In some implementations, the instructions can be received in a propagated signal, for example, over the transceiver 2568 or the external interface 2562.

The mobile computing device 2550 may communicate wirelessly through the communication interface 2566, which may include digital signal processing circuitry where necessary. The communication interface 2566 may provide for communications under various modes or protocols, such as GSM voice calls (Global System for Mobile communications), SMS (Short Message Service), EMS (Enhanced Messaging Service), or MMS messaging (Multimedia Messaging Service), CDMA (code division multiple access), TDMA (time division multiple access), PDC (Personal Digital Cellular), WCDMA (Wideband Code Division Multiple Access), CDMA2000, or GPRS (General Packet Radio Service), among others. Such communication may occur, for example, through the transceiver 2568 using a radio-frequency. In addition, short-range communication may occur, such as using a Bluetooth®, Wi-Fi™, or other such transceiver (not shown). In addition, a GPS (Global Positioning System) receiver module 2570 may provide additional navigation- and location-related wireless data to the mobile computing device 2550, which may be used as appropriate by applications running on the mobile computing device 2550.

The mobile computing device 2550 may also communicate audibly using an audio codec 2560, which may receive spoken information from a user and convert it to usable digital information. The audio codec 2560 may likewise generate audible sound for a user, such as through a speaker, e.g., in a handset of the mobile computing device 2550. Such sound may include sound from voice telephone calls, may include recorded sound (e.g., voice messages, music files, etc.) and may also include sound generated by applications operating on the mobile computing device 2550.

The mobile computing device 2550 may be implemented in a number of different forms, as shown in the figure. For example, it may be implemented as a cellular telephone 2580. It may also be implemented as part of a smart-phone 2582, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms machine-readable medium and computer-readable medium refer to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term machine-readable signal refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network (LAN), a wide area network (WAN), and the Internet.

The computing system can include clients and servers. A client and server are generally remote from each other and typically interact through a communication network. The relationship of client and server arises by virtue of computer programs running on the respective computers and having a client-server relationship to each other.

What is claimed is:

1. A method of sample analysis, the method comprising:
   placing a sample within a micro coil, wherein the sample comprises a biological sample and a hyperpolarized substance comprising an active nucleus selected from the group consisting of $^1H$, $^{13}C$, $^{31}P$, $^{15}N$, $^{19}F$;
   exposing the sample and micro coil to a $B_0$ magnetic field; and
   determining in real-time a metabolic flux of the sample via detection of an NMR signal for the sample;
   wherein:
      the biological sample comprises a member selected from the group consisting of a suspension of cells, a solid tissue sample, a porous structure encapsulating cells, a tumor organoid, proteins and/or metabolites, bacteria, yeast, an enzymatic system, and blue/green algae; and
      the micro coil has a diameter of no greater than 5 mm.

2. The method of claim 1, wherein the sample further comprises a a non-living sample comprising a synthetic cell system, a synthetic enzymatic system, chemical molecules, or mixtures thereof.

3. The method of claim 1, wherein the hyperpolarized substance undergoes hyperpolarization via Para-Hydrogen Induced Polarization (PHIP), Dynamic Nuclear Polarization (DNP), Spin-Exchange Optical Pumping, Parahydrogen Induced Polarization or other Gas-Induced Polarization.

4. The method of claim 1, wherein the method further comprises obtaining the hyperpolarized substance by hyperpolarizing a substance comprising an active nucleus,
   wherein:
      the hyperpolarizing comprises:
         introducing a radical source to the substance, wherein the radical source comprises a member selected from the group consisting of organic persistent free radicals, photo-induced non-persistent radicals, nanodiamonds or metabolites which can form temporary radicals, and silicon particles; and
         hyperpolarizing the substance in a polarizer to obtain the hyperpolarized substance; and
   the active nucleus is selected from the group consisting of $^1H$, $^{13}C$, $^{31}P$, $^{15}N$, and $^{19}F$.

5. The method of claim 1, wherein the hyperpolarized substance comprises a member selected from the group consisting of hyperpolarized $^{13}C$-pyruvate, $^{13}C$-DHA, and $^{13}C$-VitC (Vitamin C), $^{13}C$-fructose, $^{13}C$-glucose, $^{13}C$-glutamine, $^{13}C$-serine, $^{13}C$-glycine, and $^{13}C$-acetate.

6. The method of claim 1, wherein the biological sample comprises a quantity of cells selected from the group consisting of no greater than 200k cells, no greater than 150k cells, no greater than 100k cells, no greater than 50k cells, no greater than 25k cells, and no greater than 10k cells.

7. The method of claim 1, wherein the sample comprises a volume of no greater than 100 µL.

8. The method of claim 1, wherein the $B_0$ magnetic field is from about 0.5 T to 7 T.

9. The method of claim 1, comprising monitoring an enzymatic reaction rate, wherein the enzymatic reaction rate is monitored at a rate of less than 500 pmol/sec.

10. The method of claim 1, further comprising placing each of a plurality of samples within a separate micro coil chamber or compartment to obtain a high throughput signal and/or metabolic data detection.

11. The method of claim 1, wherein the micro coil diameter is in a range from about 0.5 mm to about 2 mm.

12. The method of claim 1, wherein the sample comprises cells from a tumor biopsy and/or cancer stem cells.

13. The method of claim 1, wherein the sample comprises cells acquired from a subject following administration of a drug.

14. A hyperpolarized micro-NMR system comprising:
   a magnet for producing a $B_0$ magnetic field from about 0.5 T to 7 T;
   a micro-coil chamber sized and shaped to contain a sample comprising a biological sample and a hyperpolarized substance comprising an active nucleus selected from the group consisting of $^1H$, $^{13}C$, $^{31}P$, $^{15}N$, and $^{19}F$;
   a first tuning circuit;
   a second tuning circuit;
   a mechanical switch, wherein the mechanical switch selects the first tuning circuit or the second tuning circuit;
   a detector for detecting a NMR signal for the sample, wherein the system monitors an enzymatic reaction rate in real-time; and
   a processor of a computing device for executing instructions to determine metabolic flux for the sample from the NMR signal;
   wherein the micro-coil chamber comprises a micro-coil having a diameter of no greater than 5 mm.

15. The micro-NMR system of claim 14, wherein the first tuning circuit is a tuning circuit for $^1H$.

16. The micro-NMR system of claim 14, wherein the second tuning circuit is a tuning circuit for $^{13}C$.

17. The micro-NMR system of claim 14, wherein the processor of the computer device monitors an enzymatic reaction rate via detection of the NMR signal to determine the metabolic flux, wherein the enzymatic reaction rate is less than 500 pmol/sec.

18. The micro-NMR system of claim 14, configured to perform a method of sample analysis, the method comprising:
   placing the sample within the micro coil;
   exposing the sample and micro coil to the $B_0$ magnetic field; and
   determining in real-time a metabolic flux of the sample via detection of a NMR signal for the sample;

wherein:
the biological sample comprises a member selected from the group consisting of a suspension of cells, a solid tissue sample, a porous structure encapsulating cells, a tumor organoid, proteins and/or metabolites, bacteria, yeast, an enzymatic system, and blue/green algae.

19. The micro-NMR system of claim 14, wherein the micro coil has a diameter in a range from about 0.5 mm to about 2 mm.

20. The micro-NMR system of claim 14, wherein the system comprises a polarization module comprising a member selected from the group consisting of a Para-Hydrogen Induced Polarization (PHIP) module, a Dynamic Nuclear Polarization (DNP) module, a Spin-Exchange Optical Pumping module, a Parahydrogen Induced Polarization module, and other Gas-Induced Polarization module.

* * * * *